United States Patent [19]

Graupe

[11] Patent Number: 5,721,694
[45] Date of Patent: Feb. 24, 1998

[54] NON-LINEAR DETERMINISTIC STOCHASTIC FILTERING METHOD AND SYSTEM

[75] Inventor: Daniel Graupe, Highland Park, Ill.

[73] Assignee: Aura System, Inc., El Segundo, Calif.

[21] Appl. No.: 241,179

[22] Filed: May 10, 1994

[51] Int. Cl.$^6$ .................................................. H04B 15/00
[52] U.S. Cl. .................... 364/574; 364/576; 364/724.19; 364/724.01; 395/2.35
[58] Field of Search .................................. 364/574, 576, 364/724.19, 485, 724.01; 342/101, 192, 195, 196; 381/71, 94, 73.1, 46, 47, 68.2, 98; 395/2.35–2.37, 2.77, 2.78; 382/280, 260–265

[56] References Cited

U.S. PATENT DOCUMENTS

| | | | |
|---|---|---|---|
| 4,025,721 | 5/1977 | Graupe et al. | 381/47 |
| 4,918,633 | 4/1990 | Sullivan | 364/574 |
| 5,012,519 | 4/1991 | Adlersberg et al. | 381/47 |
| 5,097,510 | 3/1992 | Graupe | 381/47 |
| 5,140,640 | 8/1992 | Graupe et al. | 381/71 |
| 5,243,351 | 9/1993 | Rafanelli et al. | 342/351 |

OTHER PUBLICATIONS

P. Graupe, Time Series Analysis, Identification and Adaptive Filtering, Adaptive Filtering with Unknown Parameters of Signal and of Noise, 1989, pp. 221–226.

Stephane G. Mallat, A Theory for Multiresolution Signal/Decomposition: The Wavelet Representation, IEEE Trans. of Pattern Analysis and Machine Intelligence, vol. 11, pp. 674–693, 1989.

Graupe, Blind Adaptive Filtering of Unknown Speech From Unknown Noise In A Single Receiver Situation, 1992, pp. 2617–2620.

Graupe et al., An Output-Whitening Approach to Adaptive Active Noise Cancellation, 1991, pp. 1306–1313.

Graupe et al., An Adaptive-Control-Based Noise Cancellation Approach, 1991, pp. 21–24.

Weenackody et al., Variable Step-Size Blind Adaptive Equalization Algorithms, 1991, pp. 718–721.

Graupe et al., Self Adaptive Filtering of Noise From Speech: A Hearing Aid Application, 1988, pp. 2619–2624.

Primary Examiner—Ellis B. Ramirez
Assistant Examiner—Hal P. Wachsman
Attorney, Agent, or Firm—Sitrick & Sitrick

[57] ABSTRACT

A method and system for filtering a noisy input comprised of an information signal and a noise signal. No prior time domain value information or frequency domain parameter information on the information signal or noise signal is available. A whitening filter renders the noise part of a noise signal into a substantially white noise signal. A fourier transform system provides an amplitude spectrum output and a phase output. A multiplier squares the amplitude spectrum output thus providing a power spectrum output. A zero mean sub-system generates a zero mean power spectrum output from the power spectrum output. A square root sub-system squares the zero mean power spectrum output thus providing a resultant output. An inverse Fourier transform sub-system inversely transforms the resultant output to provide a time domain resultant output. An inverse whitening filter provides a substantially noise free output from the time domain resultant output.

32 Claims, 11 Drawing Sheets

(independent variable of the wavelet transform (independent variable of the wavelet transform

NON-LINEAR DETERMINISTIC STOCHASTIC FILTERING METHOD AND SYSTEM

BACKGROUND OF THE INVENTION

This invention relates to a filtering system and more particularly to a system for filtering noise from a noisy input comprising an information signal combined with a noise signal, where neither the parameters of the information signal or the noise are available and where there is no individual access to the information signal alone or to the noise alone. This is, in part, an extension of the present Applicant's previous work on blind adaptive filtering as taught in U.S. Pat. No. 5,097,510.

Prior attempts to solve the problem of noise reduction have not achieved satisfactory results in high noise levels say of −10 dB Signal to Noise Ratios (SNR) or at more negative ratios. With blind adaptive filtering ("BAF"), there is a limit of noise reduction. Because BAF processing constitutes a priori processing forward in time, it is a predictive process, and there is a limit to what a predictor can do. That predictor error limit would be achieved in theory, if the BAF were to work perfectly correct, without any mistakes. In non-real-time image processing, the processing could work both forward and backward in time, in an iterative way, and aposteriori methods could be used to clean up the image beyond the predictor error's limit, taking as much time as was needed. In signal processing you don't have that much time because the results of the filtering must be ready in real time or very close to it. A very short delay can often be allowed, but this does not permit iterating several times backwards and forwards in time as is necessitated in the cases where the input noise is unknown and of any arbitrary and unknown parameters until the signal, which is also unknown and of unknown parameters, is converted to a clean signal. In communications, this is not practical because of the huge amount of computation time that is involved, and since the signal itself is apriori unknown and is of unknown parameters.

The following references are incorporated herein by reference:

[1] D. Graupe and G. D. Causey, U.S. Pat. No. 4,025,721 (May 24, 1977); D. Graupe and G. D. Causey, U.S. Pat. No. 4,185,168 (Jan. 22, 1980) D. Graupe, U.S. Pat. No. 5,097,510 (Mar. 17, 1992)

[2] D. Graupe, "Time Series Analysis, Identification and Adaptive Filtering", 2nd Edition, Krieger Publishing Co., Malabar, Fla. 1989.

[3] D. Graupe, "Blind Adaptive Filtering of Unknown Speech from Unknown Noise in a Single Receiver Situation", Proceedings of IEEE/ISCAS Conference, San Diego, Calif. 1992

[4] M. A. Weiss and E. Aschkenasy, "Study and Development of the Intel Technique for Improving Speech Intelligibility", Technical Report RADS-TR-75-108, Rome Air Development Center, Griffith AFB, New York 1975.

[5] O. Rioul and M. Vetterli, "Wavelets and Signal Processing", IEEE Signal Processing Magazine, IEEE Signal Processing Society, pp. 14–38, October, 1991 (especially see p. 31 and FIG. 13).

[6] D. Graupe and A. Efron, U.S. Pat. No. 5,140,640 (Aug. 18, 1992)

[7] General References on Fourier Transforms and Computations (estimates) of Power Spectrum (Power Spectral Density):

M. Schwartz and L. Shaw, "Signal Processing, Discrete Spectral Analysis, Detection and Estimation", McGraw Hill, NY 1975 (especially see pp 115/116, 159/160 thereof)

[8] S. G. Mallat, "A Theory for Multiresolution Signal Decomposition—Wavelet Representation", IEEE Trans. of Pattern Analysis and Machine Intelligence, Vol. 11, pp. 674–693, 1989 (see in particular, the D4 transform is the Isabelle Daubechies D4 transform discussed in the paper above by Mallat).

[9] J. R. Deller, Jr., J. G. Prookis, and J. H. L. Hansen, "Discrete Time Processing of Speech Signals", Macmillian Publishing Co., N.Y., ©1993, (see pages 360–589).

References [1], [2], and [3] provide teachings relating to BAF.

References [4] and [7] provide teachings relating to the power spectrum of white noise and to the ceptstrum (the spectrum of the spectrum.

References [5] and [8] provide teachings relating to wavelet transforms.

References [2] and [6] provide teachings related to ANC.

Reference [9] provides teaching related to liftering.

The concept of blind adaptive filtering (BAF) is illustrated as follows. Since only $\{y_k\}$ is available, we first identify a time series model for $y_k$. We shall consider a linear AR model. Specifically, identification will thus be performed to estimate the parameters of the following pure AR model of $y_k$ $$y_k = \sum_{i=1}^{n} a_i y_{k-i} + \mu_k \qquad (1)$$

$\mu_k$ being a white noise residual that is second movement ergodic (s.m.e.).

Considering the above, estimates $\hat{a}_i$ of $a_i$ of eq. (1) can be obtained in a stochastically convergent manner via algorithms well known in the art. Due to the computational effort in adaptive filtering, an SLS or LS lattice algorithm should be employed, noting their property of fastest convergence rate and of robustness (insensitivity) to round-off errors.

Once $\hat{a}_i$ have been identified, the parameters of the time series models of $s_k$ and $n_k$ are estimated. For this purpose, and without loss of generality, the information signal model is considered in terms of a pure AR model, namely $$s_k = \sum_{i=1}^{r} \phi_i s_{k-i} + w_k \qquad (2)$$

$w_k$ being s.m.e. white noise. The noise model satisfies without loss of generality, a pure MA model, given by:

$$n_k = \sum_{j=0}^{p} \lambda_j v_{k-j}; \lambda_0 = 1. \qquad (3)$$

$v_k$ being white noise.

Substituting $y_k = s_k + n_k$ into (2), $s_k$ satisfies $$y_k - n_k = \sum_{i=1}^{r} \phi_i(y_{k-i} - n_{k-i}) + w_k \qquad (4)$$

$$y_k - \sum_{i=1}^{r} \phi_i y_{k-1} = n_k - \sum_{i=1}^{r} \phi_i n_{k-1} + w_k \qquad (5)$$

Equation (5) plays a major role in our further derivations. It implies that if no measurement noise is present in $y_k$, i.e., if $$n_k = 0 \qquad (6)$$

then the pure AR model for the measurements $y_k$ is of the same order as the pure AR model for the information signal $s_k$, as in eq. (2). If $n_k$ is white noise, then $y_k$ will satisfy a mixed ARMA model whose AR part is of order r and whose MA part is also of order r. The latter is obvious if a generalized ARMA model is of the form:

$$y_k - \sum_{i=1}^{r} \phi_i y_{k-1} = \sum_{j=0}^{m} \Omega_j \mu_{k-j} \quad (7a)$$

$$E[\rho_k \rho_{k-j}] \neq 0 \ \forall j \leq m \text{ and } \Omega_0 = 1 \quad (7b)$$

without loss of generality where $\mu_k$ is white noise as in eq. (1) the MA part of the model being the right-hand side of eq. (7a).

Denoting the MA part of eq. (137) as:

$$E[\rho_k \rho_{k-j}] = 0 \ \forall j > m \quad (8)$$

then $$\rho_k \triangleq \sum_{j=0}^{m} \Omega_j \mu_{k-j} \quad (9a)$$

Since every white noise sequence can be considered as a sum of two mutually uncorrelated white noise sequences, then obviously the right-hand side of eq. (5) can be considered as an MA part of a mixed ARMA model of order r noting the equivalence of eqs. (5) and (137), for $n_k$ being white noise. Now, by properties of polynomial division, if the mixed ARMA model for $y_k$ as in eq. (5) is of orders (r, r), namely, the AR part and the MA part being each of order r, then the resulting pure AR model for $y_k$ is of an order that is higher than 2r. Hence, if measurement noise $n_k$ exists in $y_k$ then the resulting AR model for the measurements $y_k$ is of an order that is considerably higher than that for the signal model of $s_k$ itself, when $n_k$ is white noise. If $n_k$ is colored then the order of the MA part of eq. (5) is considerably higher than r assuming that the AR part is still of order r as in eq. (5). Hence the pure AR model of $y_k$ for colored $n_k$ is of an even higher order than for white $n_k$. These order properties of $y_k$ will be further used below in discriminating between information signal and noise.

Estimates of the parameters of the time series models for $s_k$ and $n_k$ by substituting for $n_k$ are derived from eq. (3), s.t. eq. (5) becomes (10a)

$$y_k - \sum_{i=1}^{r} \phi_i y_{k-1} = \sum_{j=0}^{p} \lambda_j v_{k-j} - \sum_{i=1}^{r} \phi_i \sum_{j=0}^{p} \lambda_j v_{k-i-j} + \quad (10a)$$

$$w_k = \sum_{h=0}^{p+r} \eta_h v_{k-h} + w_k$$

and, without loss of generality $$\eta_0 = 1. \quad (10b)$$

Furthermore, by eq. (12.30)

$$E[v_q w_k] = 0 \ \forall k, l \quad (11)$$

Hence, noting that $v_k$ and $w_k$ are both inaccessible and since any white noise sequence can be considered to be a sum of two mutually independent white noise sequences, eq. (140) can be written without loss of generality as:

$$y_k - \sum_{i=1}^{r} \phi_i y_{k-1} = \sum_{h=0}^{p+r} \Omega_h \mu_{k-h} \triangleq P_k \quad (12)$$

with $$\Omega_0 = 1 \quad (13)$$

$\mu_k$ being a white noise sequence s.t., by eq. (10):

$$E[P_k^2] = \sum_{h=0}^{p+r} \Omega_h^2 M = \sum_{h=0}^{p+r} \eta_h^2 V + W \quad (14)$$

$$E[P_k P_{k-1}] = \sum_{h=1}^{p+r} \Omega_h \Omega_{h-1} M = \sum_{h=1}^{p+r} \eta_{h-1} \eta V$$

$$E[P_k P_{k-(p+r)}] = \Omega_{p+r} \Omega_0 M = \eta_{p+r} \eta_0 V = \Omega_{p+r} V$$

where $$E[v_k^2] \triangleq V \quad (15a)$$

$$E[\mu_k^2] \triangleq M \quad (15b)$$

$$E[w_k^2] \triangleq W \quad (15c)$$

Noting that a pure AR model for $y_k$ as in eq. (1) has already been identified, a mixed ARMA model for $y_k$ can be derived by polynomial division. Specifying the AR and the MA orders of that mixed ARMA model as (r;p+r), then the resulting ARMA model must, by eqs. (1) to (5), satisfy eq. (12). Hence, estimates of $\phi_i$ and $\Omega_h$ of eq. (12.42) can be uniquely obtained from that polynomial division, s.t., $$a(B) = \phi(B)/\Omega(B) \quad (16)$$

where $$a(B) \triangleq a_0 - a_1 B - \ldots - a_n B^n; \ a_0 = 1 \quad (17a)$$

$$\phi(B) \triangleq 1 + \Omega_1 B + \ldots - \phi_r B^r \quad (17b)$$

$$\Omega(B) \triangleq 1 + \Omega_1 B + \ldots + \Omega_{p+r} B^{p+r} \quad (17c)$$

Furthermore, via the above identified $\phi_i$, $\Omega_h$, convergent estimates of $E[\rho_k \rho_{k-i}]$ are also derivable. Also, noting eq. (140), $\eta_h$ satisfies $$\eta(B) = \phi(B) \lambda(B) \quad (18)$$

where $$\eta(B) = 1 + \eta_1 B + \ldots + \eta_{p+r} B^{p+r} \quad (19a)$$

$$\phi(B) = 1 - \phi_1 B - \ldots - \phi_r B^r \quad (19b)$$

$$\lambda(B) = 1 + \lambda_1 B + \ldots + \lambda_p B^p \quad (19c)$$

Hence, eqs. (14) and (18) yield 2(p+r)+1 equations in the 2p+r+2 unknowns, $W$, $V$, $\eta_1 \ldots \eta_{p+r}$, $\lambda_1 \ldots \lambda_p$. Solutions are thus obtainable if $r \geq 1$, as is obviously the case, since r is the order of the pure AR model for the information signal $s_k$, while r=0 reduces the problem to the trivial case where the information signal $s_k$ (eq. 133) is white noise. The uniqueness of the solution for the given models is guaranteed since $W$ and $V$ must be positive real, as long as the mixed ARMA model is invertible and stable. Therefore noninvertible or unstable solutions are ignored.

To build a multiresolution representation based on the differences of information available at two successive resolutions $2^j$ and $2^{j+1}$. This section shows that such a representation can be computed by decomposing the signal using a wavelet orthonormal basis.

A. The Detail Signal

Here, we explain how to extract the difference of information between the approximation of a function f(x) at the resolutions $2^{j+1}$ and $2^j$. This difference of information is called the detail signal at the resolution $2^j$. The approximation at the resolution $2^{j+1}$ and $2^j$ of a signal are respectively equal to its orthogonal projection on $V_{2^{j+1}}$ and $V_{2^j}$. By applying the projection theorem, we can easily show that the detail signal at the resolution $2^j$ is given by the orthogonal projection of the original signal on the orthogonal complement of $V_{2^j}$ in $V_{2^{j+1}}$. Let $O_{2^j}$ be this orthogonal complement, i.e., $O_{2^j}$ is orthogonal to $V_{2^j}$, $O_{2^j} \oplus V_{2^j} = V_{2^{j+1}}$.

To compute the orthogonal projection of a function f(x) on $O_{2^j}$, we need to find an orthonormal basis of $O_{2^j}$. Theorem 1 shows that such a basis can be built by scaling and translating a function $\psi(x)$.

Theorem 1: Let $(V_{2^j})_{j \in \mathbb{Z}}$ be a multiresolution vector space sequence, $\phi(x)$ the scaling function, and H the corresponding conjugate filter. Let $\psi(x)$ be a function whose Fourier transform is given by $$\hat{\psi}(\omega) = G\left(\frac{\omega}{2}\right) \hat{\phi}\left(\frac{\omega}{2}\right) \tag{20}$$

with $G(\omega) = e^{-j\omega} \overline{H(\omega + \pi)}$

Let $\psi_{2^j}(x) = 2^j \psi(2^j x)$ denote the dilation of $\psi(x)$ by $2^j$. Then $(\sqrt{2^{-j}} \psi_{2^j}(x - 2^{-j}n))_{n \in \mathbb{Z}}$ is an orthonormal basis of $O_{2^j}$, and $(\sqrt{2^{-j}} \psi_{2^j}(x - 2^{-j}n))_{(n,j) \in \mathbb{Z}}$ is an orthonormal basis of $L^2(\mathbb{R})$. $\psi(x)$ is called an orthogonal wavelet.

An orthonormal basis of $O_{2^j}$ can thus be computed by scaling the wavelet $\psi(x)$ with a coefficient $2^j$ and translating it on a grid whose interval is proportional to $2^{-j}$. The wavelet function is the Haar wavelet 1 if $0 \leq x < \frac{1}{2}$ $\psi(x) = -1$ if $\frac{1}{2} \leq x < 1$ 0 otherwise This wavelet is not even continuous. In many applications, we want to use a smooth wavelet. For computing a wavelet, we can define a function $H(\omega)$, compute the corresponding scaling function $\phi(x)$ with equation (18) and the wavelet $\psi(x)$ with (19). Depending upon choice of H(w), the scaling function $\phi(x)$ and the wavelet $\psi(x)$ can have good localization both in the spatial and Fourier domains. Daubechies studied the properties of $\phi(x)$ and $\psi(x)$ depending upon H(w). The first wavelets found by Meyer are both $C^\infty$ and have an asymptotic decay which falls faster than the multiplicative inverse of any polynomial. Daubechies shows that for any n>0, we can find a function H(w) such that the corresponding wavelet $\psi(x)$ has a compact support and is n times continuously differentiable. The wavelets described are exponentially decreasing and are in $C^n$ for different values of n. These particular wavelets have been studied by Lemarie and Battle.

The decomposition of a signal in an orthonormal wavelet basis gives an intermediate representation between Fourier and spatial representations. The properties of the wavelet orthonormal bases are discussed by Meyer in an advanced functional analysis book. Due to this double localization in the Fourier and the spatial domains, it is possible to characterize the local regularity of a function f(x) based on the coefficients in a wavelet orthonormal basis expansion. For example, from the asymptotic rate of decrease of the wavelet coefficients, we can determine whether a function f(x) is n times differentiable at a point $x_0$. The energy of a wavelet in the Fourier domain is essentially concentrated in the intervals $[-2\pi, -\pi] \cup [\pi, 2\pi]$.

Let $P_{O_{2^j}}$ be the orthogonal projection on the vector space $O_{2^j}$. As a consequence of Theorem 1, this operator can now be written:

$$P_{O_{2^j}} f(x) = 2^{-j} \sum_{n=-\infty}^{+\infty} [f(u), \psi_{2^j}(u - 2^{-j}n)] \tag{21}$$

$\psi_{2^j}(x - 2^{-j}n)$.

$P_{O_{2^j}} f(x)$ yields to the detail signal of f(x) at the resolution $2^j$. It is characterized by the set of inner products $$D_{2^j} f = ([f(u), \psi_{2^j}(u - 2^{-j}n)])_{n \in \mathbb{Z}} \tag{22}$$

$D_{2^j} f$ is called the discrete detail signal at the resolution $2^j$. It contains the difference of information between $$A^d_{2^{j+1}} f \text{ and } A^d_{2^j} f.$$

As we did in (12), we can prove that each of these inner products is equal to the convolution of f(x) with $2^{-j}n$ $$[f(u), \psi_{2^j}(u - 2^{-j}n)] = (f(u) * \psi_{2^j}(-u))(2^{-j}n). \tag{23}$$

Equations (21) and (23) show that the discrete detail signal at the resolution $2^j$ is equal to a uniform sampling of (f(u), $\psi_{2^j}(-u)$)(x) at the rate $2^j$ $$D_{2^j} f = ((f(u) * \psi_{2^j}(-u))(2^{-j}n))_{n \in \mathbb{Z}}.$$

The wavelet $\psi(x)$ can be viewed as a bandpass filter whose frequency bands are approximatively equal to $[-2\pi, -\pi] \cup [\pi, 2\pi]$. Hence, the detail signal $D_{2^j} f$ describes f(x) in the frequency bands $[-2^{-j+1}\pi, -2^{-j}\pi] \cup [2^{-j}\pi, 2^{-j+1}\pi]$.

We can prove by induction that for any J>0, the original discrete signal $A_{2^{-J}}^d f$ measured at the resolution 1 is represented by $$A_{2^{-J}}^d f, (D_{2^j} f)_{-J \leq j \leq -1}. \tag{25}$$

This set of discrete signals is called an orthogonal wavelet representation, and consists of the reference signal at a coarse resolution $A_1^d f$ and the detail signals at the resolutions $2^j$ for $-J \leq j \leq -1$. It can be interpreted as a decomposition of the original signal in an orthonormal wavelet basis or as a decomposition of the signal in a set of independent frequency channels as in Marr's human vision model. The independence is due to the orthogonality of the wavelet functions.

It is difficult to give a precise interpretation of the model in terms of a frequency decomposition because the overlap of the frequency channels. However, this overlap can be controlled thanks to the orthogonality of the decomposition functions. That is why the tools of functional analysis give a better understanding of this decomposition. If the overlapping spectral supports is ignored, the interpretation in the frequency domain provides an intuitive approach to the model. In analogy with the Laplacian pyramid data structure, $A_{2^{-J}}^d f$, provides the top-level Gaussian pyramid data, and the $D_{2^j} f$ data provide the successive Laplacian pyramid levels. Unlike the Laplacian pyramid, however, there is no oversampling, and the individual coefficients in the set of data are independent.

B. Implementation of an Orthogonal Wavelet Representation

In this section, we describe a pyramidal algorithm to compute the wavelet representation is described. It is shown that $D_{2^j} f$ can be calculated by convolving $A_{2^{j+1}}^d f$ with a discrete filter G whose form we will characterize.

For any n∈Z the function $\psi_{2^j}(x-2^{-j}n)$ is a member of $O_{2^j} \subset V_{2^{j+1}}$. This function can be expanded in an orthonormal basis of $V_{2^{j+1}}$ $$\psi_{2^j}(x-2^{-j}n) = 2^{-j-1} \sum_{k<-\infty}^{+\infty} \langle \psi_{2^j}(u-2^{-j}n), \phi_{2^{j+1}}(u-2^{-j-1}k) \rangle \quad (25)$$

$$\phi_{2^{j+1}}(x - 2^{-j-1}k).$$

By changing variables in the inner product integral we can prove that $$2^{-j-1}\langle \psi_{2^j}(u-2^{31 \, j}n), \phi_{2^{j+1}}(u-2_{-j-1}k)\rangle = \langle \psi_{2^{-j}}(u), \phi(u-(k-2n))\rangle.$$

Hence, by computing the inner product of f(x) with the functions of both sides of (25), we obtain $$\langle f(u), \psi_{2^j}(u - 2^{-j}n) \rangle = \quad (26)$$

$$\sum_{k=-\infty}^{+\infty} \langle \psi_{2^{-j}}(u), \phi(u-(k-2n)) \rangle \cdot \langle f(u), \phi_{2^{j+1}}(u-2^{-j-1}k) \rangle.$$

Leg G be the discrete filter with impulse response $$g(n) = \langle \psi_{2^{-j}}(u), \phi(u-n) \rangle, \quad (27)$$

and $\bar{G}$ be the symmetric filter with impulse response $\bar{g}(n) = g(-n)$. The transfer function of this filter is the function $G(\omega)$. Inserting (27) to (26) yields $$\langle f(u), \psi_{2^j}(u - 2^{-j}n) \rangle = \quad (28)$$

$$\sum_{k=-\infty}^{+\infty} \bar{g}(2n-k)\langle f(u), \phi_{2^{j+1}}(u-2^{-j-1}K) \rangle.$$

Equation (28) shows that the detail signal $D_{2^j}f$ can be computed by convolving $A_{2^{j+1}}^d$, f with the filter $\bar{G}$ and retaining every other sample of the output. The orthogonal wavelet representation of a discrete signal $A_{2^{j+1}}^d f$ into $A_{2^j}^d f$ and $D_{2^j}f$ for $-J \leq j \leq -1$.

In practice, the signal $A_j^d f$ has only a finite number of samples. One method of handling the border problems uses a symmetry with respect to the first and the last samples.

Equation (19) implies that the impulse response of the filter G is related to the impulse response of the filter H by $g(n)=(-1)^{1-n}h(1-n)$. G is the mirror filter of H, and is a high-pass filter. In signal processing, G and H are called quadrature mirror filters Equation (28) can be interpreted as a high-pass filtering of the discrete signal $A_{2^{j+1}}^d f$.

If the original signal has N samples, then the discrete signals $D_{2^j}f$ and have $2^j N$ samples each. Thus, the wavelet representation $(A_{2^{-J}}^d f, (D_{2^j}f)_{-J \leq j \leq -1})$ has the same total number of samples as the original approximated signal $A_1^d f$. This occurs because the representation is orthogonal. The energy of the samples of $D_{2^j}f$ gives a measure of the irregularity of the signal at the resolution $2^{j+1}$. Whenever $A_{2^j}f(x)$ and $A_{2^{j+1}}f(x)$ are significantly different, the signal detail has a high amplitude.

C. Signal Reconstruction from an Orthogonal Wavelet Representation

It can be seen that the wavelet representation is complete. The original discrete signal can also be reconstructed with a pyramid transform. Since $O_{2^j}$ is the orthogonal complement of $V_{2^j}$ in $V_{2^{j+1}}$, $(\sqrt{2^{-j}}\phi_{2^j}(x-2^{-j}n), \sqrt{2^{-j}}\psi_{2^j}(x-2^{-j}n))_{n \in Z}$ is an orthonormal basis of $V_{2^{j+1}}$. For any n>0, the function $\phi_{2^{j+1}}(x-2^{-j-1}n)$ can thus be decomposed in this basis $$\phi_{2^{j+1}}(x - 2^{-j-1}n) =$$

$$2^{-j} \sum_{k=-\infty}^{+\infty} \langle \phi_{2^j}(u-2^{-j}k), \phi_{2^{j+1}}(u-2^{-j-1}n) \rangle \cdot \phi_{2^j}(x-2^{-j}k) +$$

$$2^{-j} \sum_{k=-\infty}^{+\infty} \langle \psi_{2^j}(u-2^{-j}k), \phi_{2^{j+1}}(u-2^{-j-1}n) \rangle \cdot \psi_{2^j}(x-2^{-j}k).$$

By computing the inner product of each size of equation (30) with the function f(x), we have $$[f(u), \phi_{2^{j+1}}(u - 2^{-j-1}n)] = \quad (29)$$

$$2^{-j} \sum_{k=-\infty}^{+\infty} [\phi_{2^j}(u-2^{-j}k), \phi_{2^{j+1}}(u-2^{-j-1}n)] \cdot [f(u), \phi_{2^j}(u-2^{-j}k)] +$$

$$2^{-j} \sum_{k=-\infty}^{+\infty} [\psi_{2^j}(u-2^{-j}k), \phi_{2^{j+1}}(u-2^{-j-1}n)] \cdot [f(u), \psi_{2^j}(u-2^{-j}k)].$$

Inserting (14) and (25) in this expression and using the filters H and G. respectively, defined by (15) and (27) yields $$[f(u), \phi_{2^{j+1}}(u-2^{-j-1}n)] = 2 \sum_{k=-\infty}^{+\infty} h(n-2k)[f(u), \phi_{2^j}(u-2^{-j}k)] + \quad (30)$$

$$2 \sum_{k=-\infty}^{+\infty} g(n-2k)[f(u), \phi_{2^j}(u-2^{-j}k)].$$

This equation shows that $A_{2^{j+1}}^d f$ can be reconstructed by putting zeros between each sample of $A_{2^j}^d f$ and $D_{2^j}f$ and convolving the resulting signals with the filters H and G, respectively.

The original discrete signal $A_1^d f$ at the resolution 1 is reconstructed by repeating this procedure for $-J \leq j < 0$. From the discrete approximation $A_1^d f$, we can recover the continuous approximation $A_1 f(x)$ from the wavelet representation given in FIG. 6(b). By comparing this reconstruction with the original signal shown in FIG. 8(b), we can appreciate the quality of the reconstruction. The low and high frequencies of the signal are reconstructed well, illustrating the numerical stability of the decomposition and reconstruction processes.

D. Extension Of The Orthogonal Wavelet Representation To Images

The wavelet model can be easily generalized to any dimension n>0. In this section, we study the two-dimensional case for image processing applications. The signal is now a finite energy function $f(x, y) \in L^2(R^2)$. A multiresolution approximation of $L^2(R^2)$ is a sequence of subspaces of $L^2(r^2)$ which satisfies a straightforward two-dimensional extension of the properties (2) to (8). Let $(V_{2^j})_{j \in Z}$ be such a multiresolution approximation of $L^2(R^2)$. The approximation of signal f(x, y) at a resolution 2j is equal to its orthogonal projection on the vector space $V_{2^j}$. Theorem 1 is still valid in two dimensions, and one can show that there exists a unique scaling function $\phi(x, y)$ whose dilation and translation given an orthonormal basis of each space $V_{2^j}$. Let $\Phi_{2^j}(x,y) = 2^{2^j} \Phi(2^j x, 2^j y)$. The family of functions $$(2^{-j}\Phi_{2^j}(x-2^{-j}n, y-2^{-j}m))_{(n,m) \in Z}$$

forms an orthonormal basis of $V_{2^j}$. The factor $2^{-j}$ normalizes each function in the $L^2(R^2)$ norm. The function $\Phi(x, y)$ is unique with respect to a particular multiresolution approximation of $L^2(R^2)$.

We next describe the particular case of separable multiresolution approximations of $L^2(R^2)$. For such multiresolution approximations, each vector space $V_{2^j}$ can be decomposed as a tensor product of two identical subspaces of $L^2(R)$ $V_{2^j} = V_{2^j}^1 \otimes V_{2^j}^1$.

The sequence of vector spaces $(V_{2^j})_{j \in Z}$ forms a multiresolution approximation of $L^2(R^2)$ if and only if $(V_{2^j}^1)_{j \in Z}$ is a multiresolution approximation $L^2(R)$. One can then easily show that the scaling function $\Phi(x, y)$ can be written as $\phi(x_2 y) = \phi(x)\phi(y)$ where $\phi(x)$ is the one-dimensional scaling function of the multiresolution approximation $(V_{2^j}^1)_{j \in Z}$. With a separable multiresolution approximation, extra importance is given to the horizontal and vertical directions in the image. For many types of images, such as those from man-made environments, this emphasis is appropriate. The orthogonal basis of $V_{2^j}$ is then given by $$(2^{-j}\Phi_{2^j}(x-2^{-j}n,\ y-2^{-j}m))_{(n,m) \in Z^2} = (2^{-j}\phi_{2^j}(x-2^{-j}n)\phi_{2^j}(y-2^{-j}m))_{(n,m) \in Z^2}$$

The approximation of a signal $f(x, y)$ at a resolution $2_j$ is therefore characterized by the set of inner products $$A_{2^j}^d f = (\langle f(x, y)\phi_{2^j}(x-2^{-j}n)\phi_{2^j}(y-2^{-j}m)\rangle)_{(n,m) \in Z^2}$$

Let us suppose that the camera measures an approximation of the irradiance of a scene at the resolution 1. Let $A_1^d f$ be the resulting image and N be the number of pixels. Once can easily show that for $j<0$, a discrete image approximation $A_{2^j}^d f$ has $2^j N$ pixels. Border problems are handled by supposing that the original image is symmetric with respect to the horizontal and vertical borders.

As in the one-dimensional case, the detail signal at the resolution $2^j$ is equal to the orthogonal projection of the signal on the orthogonal complement of $V_{2^j}$ in $V_{2^{j+1}}$. Let $O_{2^j}$ be this orthogonal complement. The following theorem gives a simple extension of Theorem 1, and states that we can build an orthonormal basis of $O_{2^j}$ by scaling and translating three wavelets functions, $\Psi^1(x, y)$, $\Psi^2(x, y)$, and $\Psi^3(x, y)$.

Theorem 2 Let $(V_{2^j})_{j \in Z}$ be a separable multiresolution approximation of $L^2(R^2)$. Let $\Phi(x, y) = \phi(x)\phi(y)$ be the associated two-dimensional scaling function. Let $\Psi(x)$ be the one-dimensional wavelet associated with the scaling function $\phi(x)$. Then, the three "wavelets"

$$\Psi^1(x,y) = \phi(x)\psi(y),\ \Psi^2(x,y) = \psi(x)\phi(y),\ \Psi^3(x,y) = \psi(x)\psi(y)$$

are such that $$(2^{-j}\Psi_{2^j}^1(x-2^{-j}n,\ y-2^{-j}m),$$

$$2^{-j}\Psi_{2^j}^2(x-2^{-j}n,\ y-2^{-j}m),$$

$$2^{-j}\Psi_{2^j}^3(x-2^{-j}n,\ y-2^{-j}m))_{(n,m) \in Z^2}$$

is an orthonormal basis of $O_{2^j}$ and $$(2^{-j}\Psi_{2^j}^1(x-2^{-j}n,\ y-2^{-j}m),$$

$$2^{-j}\Psi_{2^j}^2(x-2^{-j}n,\ y-2^{-j}m),$$

$$2^{-j}\Psi_{2^j}^3(x-2^{-j}n,\ y-2^{-j}m))_{(n,m) \in Z^3}$$

is an orthonormal basis of $L^2(R^2)$.

The difference of information between $A_{2^{j+1}}^d f$ and $A_{2^j}^d f$ is equal to the orthonormal projection of $f(x)$ on $O_{2^j}$, and is characterized by the inner products of $f(x)$ with each vector of an orthonormal basis of $O_{2^j}$. Theorem 4 says that this difference of information is given by the three detail images $$D_{2^j}^1 f = (\langle f(x,y),\ \Psi_{2^j}^1(x-2^{-j}n,\ y-2^{-j}m)\rangle)_{(n,m) \in Z^2} \quad (31)$$

$$D_{2^j}^2 f = (\langle f(x,y),\ \Psi_{2^j}^2,\ (x-2^{-j}n,\ y-2^{-j}m)\rangle)_{(n,m) \in Z^2} \quad (32)$$

$$D_{2^j}^3 f = (\langle f(x,y),\ \Psi_{2^j}^3(x-2^{-j}n,\ y-2^{-j}m)\rangle)_{(n,m) \in Z^2} \quad (33)$$

Just as for one dimensional signals, one can show that in two dimensions the inner products which define $A_{2^j}^d f$, $D_{2^j}^1 f$, $D_{2^j}^2 f$, and $D_{2^j}^3$ fare equal to a uniform sampling of two dimensional convolution products. Since the three wavelets $\psi_1(x, y)$, $\psi_2(x, y)$, and $\psi_3(x, y)$ are given by separable products of the functions $\phi$ and $\psi$, these convolutions can be written $$A_{2^j}^d f = ((f(x,y)*\phi_{2^j}(-x)\phi_{2^j}(-y))(2^{-j}n,\ 2^{-j}m))_{(n,m) \in Z^2} \quad (34)$$

$$D_{2^j}^1 f = ((f(x,y)*\phi'(-x)\psi'(-y))(2^{-j}n,\ 2^{-j}m))_{(n,m) \in Z^2} \quad (35)$$

$$D_{2^j}^2 f = ((f(x,y)*\psi_{2^j}(-x)\phi_{2^j}(-y))(2^{-j}n,\ 2^{-j}m))_{(e,m) \in Z^2} \quad (36)$$

$$D_{2^j}^3 f = ((f(x,y)*\psi_{2^j}(-x)\psi_{2^j}(-y))(2^{-j}n,\ 2^{-j}m))_{(n,m) \in Z^2} \quad (37)$$

The expressions (34) through (37) show that in two dimensions, $A_{2^j}^d f$ and the $D_{2^j}^k$ fare computed with separable filtering of the signal along the abscissa and ordinate.

The wavelet decomposition can thus be interpreted as a signal decomposition in a set of independent, spatially oriented frequency channels. Let us suppose that $\phi(x)$ and $\psi(x)$ are respectively, a perfect low-pass and a perfect bandpass filter. The image $A_{2^{j+1}}^d f$ is decomposed into $A_{2^j}^d f$, $D_{2^j}^1 f$, $D_{2^j}^2 f$, and $D_{2^j}^3 f$. The image $A_{2^{j+1}}^d f$ corresponds to the lowest frequencies, $D_{2^j}^1 f$ gives the vertical high frequencies (horizontal edges), $D_{2^j}^2 f$ the horizontal high frequencies (vertical edges) and $D_{2^j}^3 f$ the high frequencies in both directions (the corners).

For any $J>0$, an image $A_1^d f$ is completely represented by the $3J+1$ discrete images $$(A_{2^{-J}}^d f,\ (D_{2^j}^1 f)_{-J \leq j \leq -1},\ (D_{2^j}^2 f)_{-J \leq j \leq -1},\ (D_{2^j}^3 f)_{-J \leq j \leq -1}).$$

This set of images is called an orthogonal wavelet representation in two dimensions. The image $A_{2^{-J}}^d f$ is the coarse approximation at the resolution $2^{-J}$ and the $D_{2^j}^k f$ images give the detail signals for different orientations and resolutions. If the original image has N pixels, each image $A_{2^j}^d f$, $D_{2^j}^1 f$, $D_{2^j}^2 f$, $D_{2^j}^3 f$ has $2^j N$ pixels (j<0). The total number of pixels in this new representation is equal to the number of pixels of the original image, so we do not increase the volume of data. Once again, this occurs due to the orthogonality of the representation. In a correlated multiresolution representation such as the Laplacian pyramid, the total number of pixels representing the signal is increased by a factor 2 in one dimension and of 4/3 in two dimensions.

E. Decomposition and Reconstruction Algorithms in Two Dimensions

In two dimensions, the wavelet representation can be computed with a pyramidal algorithm. The two-dimensional wavelet transform that we describe can be seen as a one-dimensional wavelet transform along the f and y axes. A two dimensional wavelet transform can be computed with a separable extension of the one-dimensional decomposition algorithm. At each step we decompose $A_{2^j}^d f$, $D_{2^j}^1 f$, $D_{2^j}^2 f$, $D_{2^j}^3 f$. We first convolve the rows of $A_{2^{j+1}}^d f$ with a one-dimensional filter, retain every other row, convolve the columns of the resulting signals with another one-dimensional filter and retain every other column. The filters used in this decomposition are the quadrature mirror filters $\bar{H}$ and $\bar{G}$.

We compute the wavelet transform of an image $A_1^d f$ by repeating this process for $-1 \geq j \geq -J$. This corresponds to a separable conjugate mirror filter decomposition [44].

The one-dimensional reconstruction algorithm described in Section C can also be extended to two dimensions. At each step, the image $A_{2^{j+1}}^d f$ is reconstructed from $A_{2^j}^d f$, $D_{2^j}^1 f$, $D_{2^j}^2 f$, and $D_{2^j}^3$. Between each column of the images $A_{2^j}^d f$, $D_{2^j}^1 f$, $D_{2^j}^2 f$, and $D_{2^j}^3 f$, we add a column of zeros, convolve the rows with a one dimensional filter, add a row of zeros between each row of the resulting image, and convolve the columns with another one-dimensional filter. The filters used in the reconstruction are the quadrature mirror filters H and G. The image $A_1^d f$ is reconstructed from its wavelet transform by repeating this process for $-J \leq j \leq -1$. If we use floating point precision for the discrete signals in the wavelet representation, the reconstruction is of excellent quality.

SUMMARY OF THE INVENTION

The present invention overcomes these limitations in signal processing, by utilizing the fact that the apriori filtering (as in certain versions of BAF or in active noise cancellation (ANC)) in theory results in the noise residual at the output (of the BAF filter (when specifically aiming in whitening as is not the general case) or of the noise canceler) being reduced to white noise for any kind of noise input. Taking the now whitened noise output for any arbitrary input noise of a blind adaptive filter, such as taught in U.S. Pat. No. 5,097,510, or of an active noise cancellation system, such as taught in U.S. Pat. No. 5,140,640, the present invention first utilizes the whitening achieved above, and then further reduces the resulting output noise from that point on. Thus, the noise that is present in the white noise at the output (of the blind adaptive filter or the active noise canceler) is further reduced by the present invention's implementation of aposteriori filtering to the output of the blind adaptive filter or the active noise canceler. The filter of the present invention analyzes a short interval of the prior stage output and analyzes it backwards in time, noting that the prior stage output is available without delay (by the apriori processing feature of BAF or of ANC as in the above patents). This interval is a very short interval, for example, on the order of ten to fifty milliseconds in the ease of speech in noise. This is essentially not audible in speech, and it poses no problem whatsoever if the information signal is an image (essentially a signal in two dimension or in three dimensions).

The invention is directed a method and a system to filter inaccessible and unknown noise of arbitrary parameters from an information-bearing signal (such as speech) (referred to below as "information signal"), where no prior time domain parameters value or frequency domain parameters value on the information signal or noise is available and where no separate access to the information signal or to the noise exists, and where filtering is accomplished by first passing the incoming signal of information signal and noise (referred to hereinafter as "noisy input") through a parameter identifier to identify its parameters by well-known identification methods such as taught in the references incorporated herein above (e.g., the BAF filter as in reference [1] or the ANC canceler as in reference [2]), to obtain the noise parameters (as explained in references [1] or [2]). This is determined from prior information on the rate of change of signal parameters or of the parameter values, and/or the order of the signal's parameter vector or the noise parameter vector, none of which assume any parameter value information, where rates of change of parameter value is the time interval over which a given parameter changes in value by 25% or more. Subsequent to this separation, the noisy input is passed through a spectrum-shaping filter, denoted "whitening filter", that utilizes the noise parameters obtained above to render the noise part of the noisy input to become substantially white noise (i.e., of a flat power spectrum over the spectral range of interest). The resultant time domain output of the whitening filter is subsequently passed through a white noise removal stage where that output is first Fourier transformed (or short-time Fourier transformed) over successive finite frames of time to yield its power spectrum (the estimate of "power spectral density" or "periodogram") of the output of the whitening filter and its phase versus frequency as afforded by well known FFT technology. The resulting power spectrum is spectrally filtered by subtracting the d.c. average of the power spectrum from the power spectrum above. The results of that spectral filtering (spectral-subtraction) is subsequently inverse Fourier transformed, while the phase spectrum obtained earlier is reapplied to return it to the time domain. Finally, the time domain output of the second inverse transform is passed through an inverse whitening filter, which is the inverse of the whitening filter used prior to the first Fourier transform, to result in a substantially noise-free output, where the spectrum of the information signal is unchanged (having been passed through a whitening filter and its exact inverse and through stages of transformation and inverse transformation), while the original noise though of an arbitrary colored spectrum (namely, of unknown spectral or time domain parameters) has been first whitened and then removed by spectral filtering (through taking advantage of the fact that white noise has a flat spectrum and that the Fourier transform of a flat function is a delta function (impulse at the origin), such that d.c. average of the power will have substantially removed that white noise with little effect on the information signal). The above invention is of greatest value for signal processing. It also allows reduction of arbitrary unknown noise from images where computational time is important.

After the spectral filtering stage has completed it operations, if residual noise of consequence is still present at the output of the last inverse-whitening filter (such as due to inaccuracies in that stage), then this output can be passed through a wavelet filter where that output is wavelet transformed, for example, using the $D_4$ wavelet transform (WT) as taught in reference [8] incorporated herein above. The WT'ed output is then passed through a threshold subsystem. Since the WT of white noise forms a cluster, whereas the WT of the non-white noise (which are due to the information signal) are substantially outside that cluster, the threshold subsystem is used to eliminate the clustered white noise while preserving the information signal. After threshold removal, an inverse WT is applied to result in an even cleaner signal. The wavelet filter must be applied only after the BAF (or ANC) whitening stage and the subsequent aposteriori white-noise removal stages, since the WT filter can only deal with low noise levels (10 dB SNR or more). Hence, noise reduction to that level must first be accomplished by the earlier stages. Thus, the total adaptive filter has three stages, namely a whitening stage, an aposteriori spectral white removal stage, and an aposteriori wavelet filtering stage.

These and other aspects and attributes of the present invention will be discussed with reference to the following drawings and accompanying specification.

BRIEF DESCRIPTION OF THE DRAWINGS

The present invention can be better understood by reference to the accompanying drawings in conjunction with the detailed description, wherein.

DETAILED DESCRIPTION OF THE PREFERRED EMBODIMENT

Figure 1A:
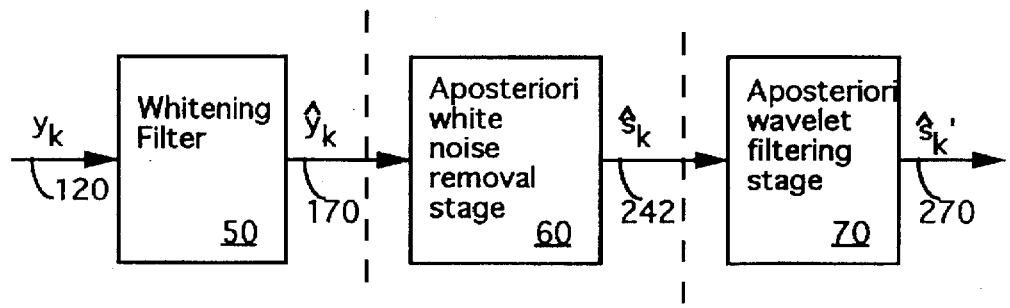
FIG. 1A is a fundamental block diagram of a three-stage non-linear filtering system.

While this invention is susceptible of embodiment in many different forms, there is shown in the drawings, and will be described herein in detail, specific embodiments thereof with the understanding that the present disclosure is to be considered as an exemplification of the principles of the invention and is not intended to limit the invention to the specific embodiments illustrated.

Figure 1B:
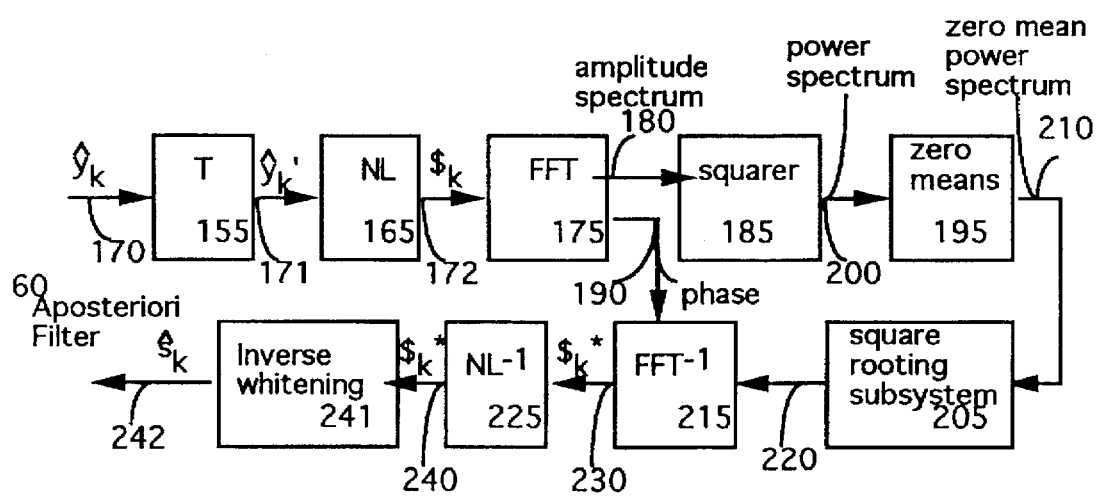
FIG. 1B is a detailed block diagram of the aposteriori white noise removal stage of FIG. 1A.
Figure 1C:
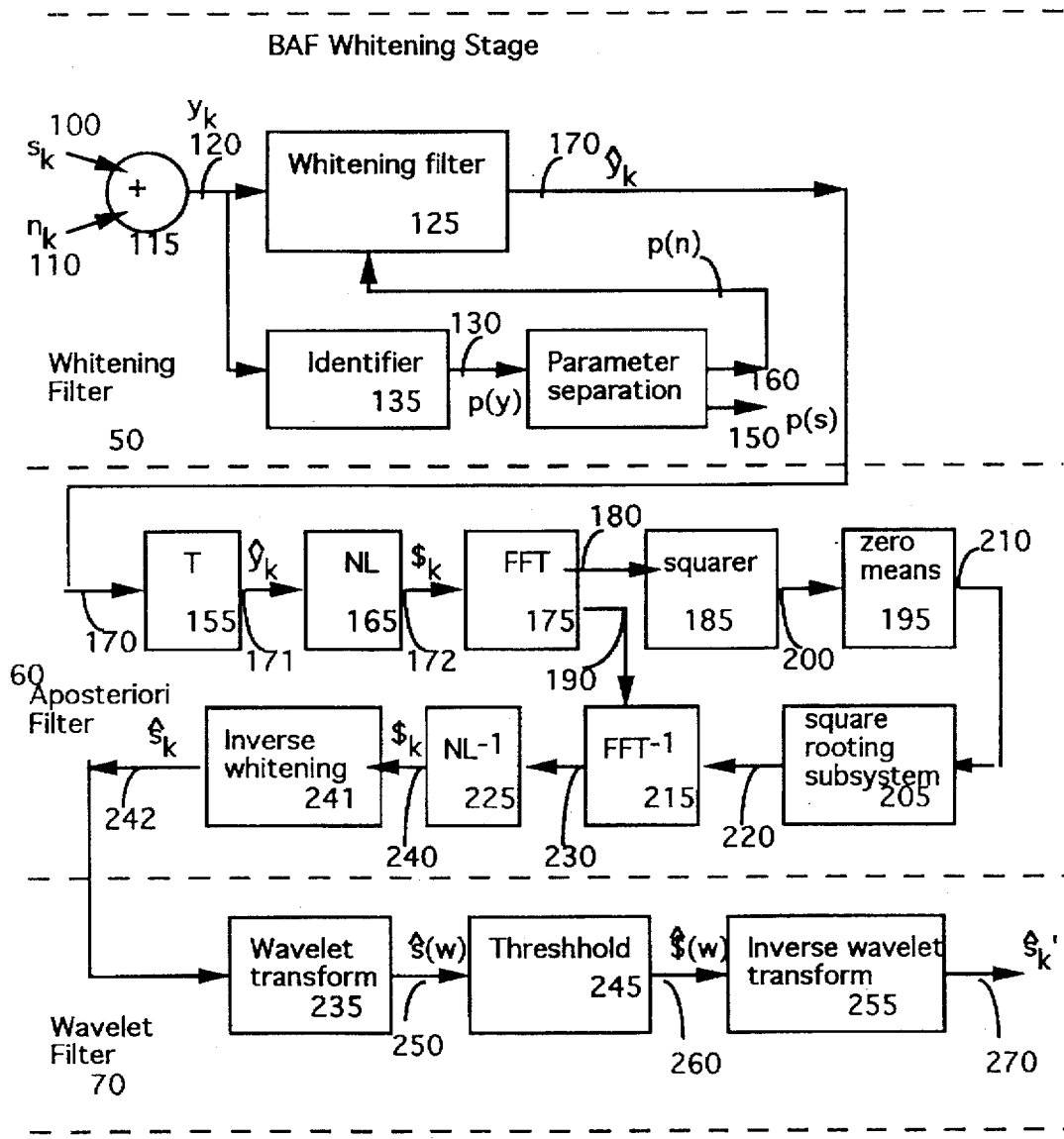
FIG. 1C is a detailed block diagram of an embodiment of the complete system of FIG. 1A.
Figure 1D:
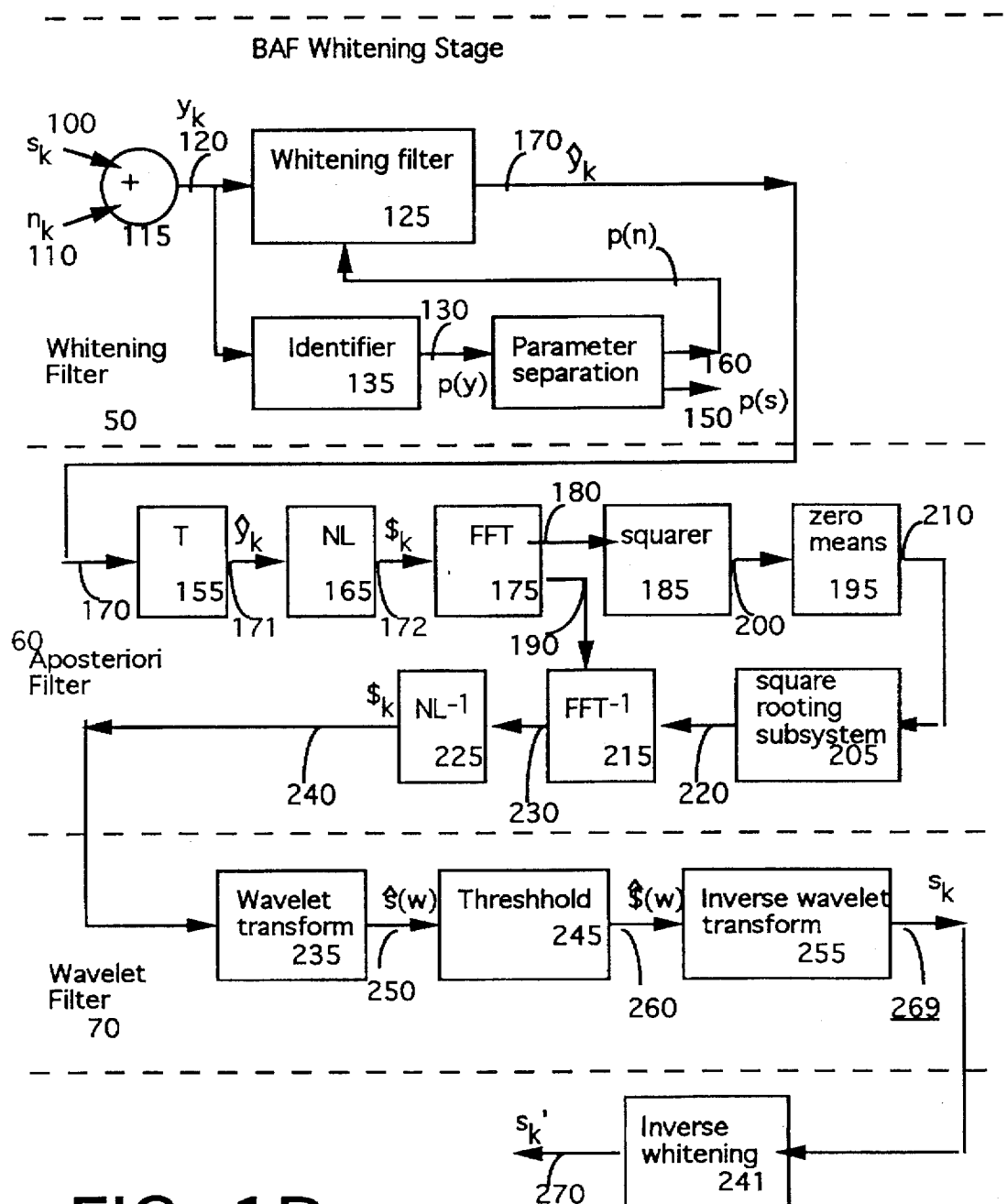
FIG. 1D is an alternate embodiment of the system of FIG. 1C, wherein the inverse whitening filter stage 241 is repositioned from before the wavelet filtering stage to after it.

Referring to FIG. 1A, a detailed block diagram of a three-stage, non-linear filtering system is illustrated. A noisy input $y_k$ 120 is comprised of a combination of an information signal $s_k$ 100 and a noise signal $n_k$ 110. The information signal can be of any type, such as representative of one-dimensional or multi-dimensional signals (e.g., 2-D, 3-D, etc.). The signal $s_k$ and the received signal plus noise $y_k$ can be line scans of an image where the value of $s_k$ for any point of a line is in terms of a gray scale level or in terms of a color coded scale, such that the complete image is obtained via scanning lines of $s_k$. The noisy input 120 is coupled to the input of whitening filter 50 which, with no prior knowledge about the information signal or noise signal, or their parameters, whitens the noise component of the noisy input $y_k$ 120 without altering the spectral content of the information signal component 100, to provide a whitening filter output $\hat{y}_k$ 170 to provide a whitened noisy input signal. The whitening filter 50 can be of a variety of types, and as discussed elsewhere herein, is preferably of a blind adaptive filter (BAF) type or an active noise cancellation filter (ANC) type, which whitens the noise component without altering the spectral content of the information signal component of the noisy input 120. The whitened noisy input $\hat{y}_k$ 170, where the effect of the input noise $n_k$ has been whitened, is output from the whitening filter 50 and is coupled to an aposteriori white noise removal stage 60 which transforms the whitened noisy input $\hat{y}_k$ 170, obtains the zero mean power spectrum thereof, then inverse transforms in subsystem 241 the zero mean power spectrum signal and performs inverse whitening filtering to cancel the effects of the whitening filter 50 on the signal at the input of subsystem 241 to provide an aposteriori white noise filtered signal output $\hat{s}_k$ 242 comprised of the information signal $s_k$ and the filtered and reduced content white noise component, wherein the signal $\hat{s}_k$ 242 has significantly reduced noise from the noisy input $y_k$ 120 and from the whitened noisy input 170. The aposteriori white noise removal stage 60 can be embodied in aposteriori filtering stage, as illustrated in FIGS. 1B–1D, or can be embodied in an aposteriori liftering stage, as illustrated and discussed with reference to FIGS. 1E and 1F. Where a whitened noisy input $\hat{y}_k$ 170 is provided to the system rather than the noisy input $y_k$ 120, the whitening filter need not be present. Where additional noise filtering and reduction is desired, the aposteriori filtered output $\hat{s}_k$ 242 is coupled to an aposteriori wavelet filtering stage 70 which wavelet transforms, thresholds, and inverse wavelet transforms the aposteriori white noise removal output $\hat{s}_k$ 242 to provide a wavelet filtered output $\hat{s}_k'$ 270. Where the wavelet filtering stage 70 is utilized, the inverse whitening filtering can either be performed as the last stage of the aposteriori white noise removal stage 60, or alternatively, as a stage subsequent to the aposteriori wavelet filter output, as illustrated respectively in FIGS. 1C and 1D.

FIG. 1B illustrates a detailed block diagram of the aposteriori white noise removal stage 60 of FIG. 1A, specifically illustrating an aposteriori white noise removal filtering stage.

The whitened noisy input $\hat{y}_k$ 170 is coupled as an input to a time delay subsystem 155 for storing the whitened noisy input $\hat{y}_k$ over a fixed time delay T, T being the interval at which $\hat{y}_k$ is updated, and for outputting the whitened noisy input $\hat{y}_k$ 170 as output $\hat{y}_k'$ 171 during the interval T. The output $\hat{y}_k'$ 171 is coupled as an input to a first non-linear function generator NL 165 for providing a first non-linear function output $\$_k$ 172, responsive to raising the output $\hat{y}_k'$ 171 by a power of m, where m is a positive integer. The output $\$_k$ is coupled as an input to an FFT subsystem 175 which derives the FFT of the first nonlinear function output $\$_k$, and provides both an amplitude spectrum output 180 and a phase spectrum output 190.

Figure 3A:
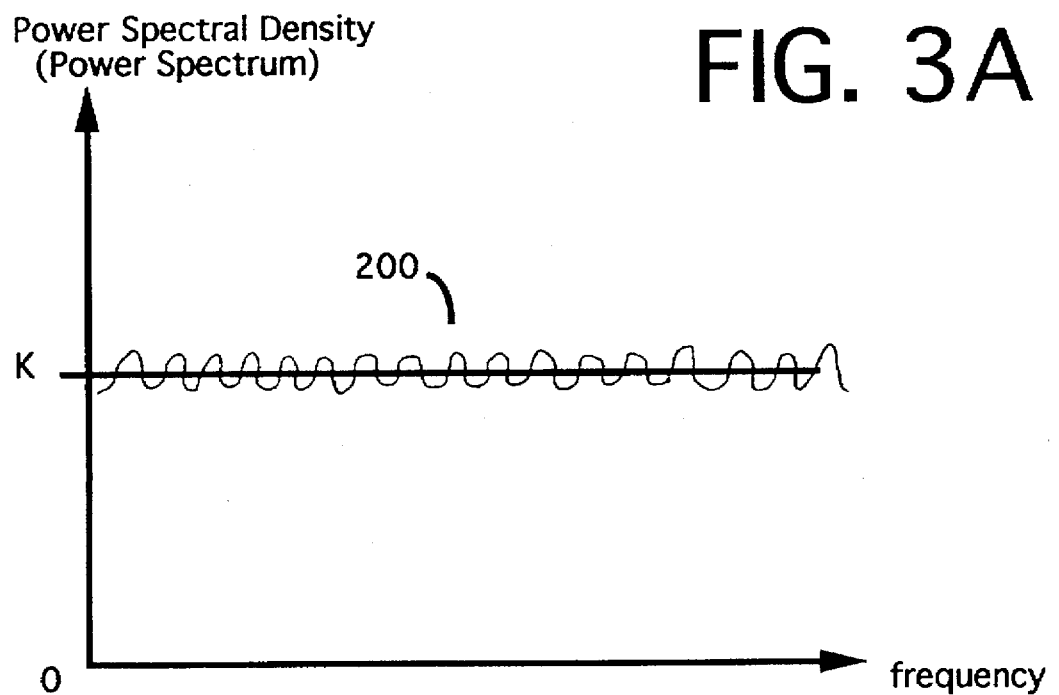
FIG. 3A illustrates the power spectrum output 200 of FIGS. 1B–1F (coupled to as an input to the zero means subsystem 195) illustrating the raw power spectrum before zero mean filtering.

The amplitude spectrum output 180 is coupled as an input to a multiplier subsystem 185, which squares the amplitude output 180 to provide a power spectrum output 200 (see FIG. 3A). The power spectrum output 200 is coupled as an input to a zero-mean subsystem 195 which takes the zero mean of the power spectrum output 200 to provide a zero mean power spectrum output 210 (see FIG. 3B).

The zero mean power spectrum output 210 is coupled as an input to a square root subsystem 205, which takes the square root of the zero mean power spectrum output 210 to provide an output 220, which is coupled as an input to an inverse FFT subsystem 215, which is responsive to the zero mean power spectrum output as square rooted in output 220 and to the FFT phase spectrum output 190, and performs an inverse FFT and provides a new time domain signal output $\$_k^*$ 230 wherein the white noise residual of the whitened noise input $\hat{y}_k$ 170 is substantially reduced. The new time domain output $\$_k^*$ 230 is coupled as an input to an inverse non-linear function generator 225 which performs the inverse function to the non-linear function generator 165, for providing a white noise filtered, second non-linear function, output $s_k^*$ 240, responsive to raising the new time domain output $\$_k^*$ by a power of 1/m. Where the whitened noisy signal $\hat{y}_k$ 170 is coupled from a whitening filter, the system is further comprised of an inverse whitening filter subsystem 241 for providing an output $s_k^{**}$ (or $\$'_k$ 242), which for BAF is responsive to applying the transform $\emptyset^{-1}(B)$ to the second non-linear function output $s_k^*$ 240.

FIG. 1C illustrates a detailed block diagram of a BAF embodiment of the system of FIG. 1A, where the whitening filter 50 is comprised of a BAF whitening filter.

Referring to FIG. 1C, an inaccessible information signal $s_k$ 100 and inaccessible colored noise $n_k$ 110 are added via a summing device 115 to provide an (accessible) observed output signal $y_k$ 120, of signal plus noise, also referred to hereinafter as a "noisy input" signal. The summation device 115 can be a microphone, a transducer, a summing amplifier, etc. The observable output (noisy input) signal $y_k$ 120 is inputted to a whitening filter 125, which performs a transform function F(B) (or $\emptyset(B)$) on the noisy input signal $y_k$ 120 to provide a whitened output signal $\hat{y}_k$ 170 (also referred to as a whitened noisy input) which is a transformed noisy input wherein the whitening filter whitens the effect of the noise $n_k$ 110 in the signal $y_k$ 120, and where B is a unit delay operator such that $Y_{k-1}=By_k$, k denoting the sampling interval, namely k=0, 1, 2, . . . and where F(B) (or $\emptyset(B)$) are obtained by having the signal $y_k$ 120 also coupled as an input to an identifier unit 135 which provides a parameter vector output $p_{(y)}$ 130. Parameter vector $p_{(y)}$ 130 is coupled as an input to parameter separation unit 145. Feature information 140, of the vector order or of the average rate of change of the parameters of $s_k$ or of the parameters of $n_k$ as is described in the above referenced patents is also coupled as an input to the parameter separation unit 140. The parameter separation unit 145 provides as its output two sets of parameter vectors, parameter vector $p_{(s)}$ 150 (the parameter vector of the information signal $s_k$ 100), and the parameter vector $p_{(n)}$ 160 (the parameter vector of the noise $n_k$ 110). The parameter vector $p_{(n)}$ 160 is coupled as an input to the whitening filter 125, and is used to tune the whitening filter 125. Thus, F(B) is a function of $p_{(n)}$, namely, for F(B)=$F_0+F_1B+F_2B^2+$ . . . $F_6B^6$, where $p_{(n)}$ will be a vector $p_{(n)}=[F_0, F_1, \ldots F_6]^t$, where t denotes the transposition of a vector, and the feature of vector order is the order the vector $p_{(n)}$ which in this example is 6.

The BAF 50 is the combination of elements shown in dashed lines consisting of the whitening filter 125, the identifier subsystem 135, and the parameter separation subsystem 145. The BAF 50, its sub-elements, and operation, including details of the transfer function F(B) is described in detail in U.S. Pat. No. 5,097,510, as discussed above.

Figure 2:
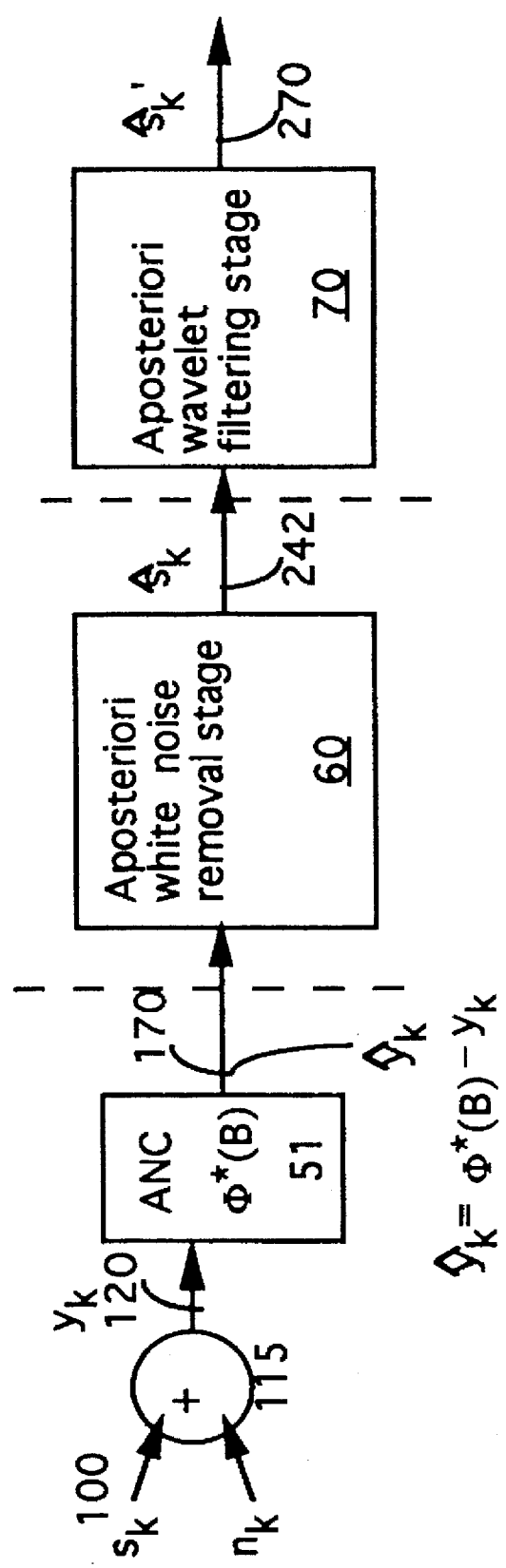
FIG. 2 is a block diagram of the system of FIG. 1A, wherein the whitening filter stage 50 is replaced by an active noise cancellation stage, allowing the present invention to be applicable to active noise cancellation embodiments as well as for blind adaptive filtering embodiments.

Due to tuning of the whitening filter 125 responsive to the parameter vector, $p_{(n)}$ 160, the effect on the noise $n_k$ 110 in the whitened output $\hat{y}_k$ 170 is to provide the information signal $s_k$ 100 embedded in white noise (i.e., the noise $n_k$ 110 being whitened). Thus, the original information signal in noise [noisy input $y_k$ 120] is converted to an information signal in white noise (whitened output signal (or whitened noisy input)) $\hat{y}_k$ 170. The same result occurs where the BAF whitening filter stage 50 of FIG. 1C is replaced with an ANC whitening filter stage 50, such as the system 51 of FIG. 2, such as in U.S. Pat. No. 5,140,640.

Thus, the whitening filter stage 50 separates and whitens the noise component $n_k$ 110 of the combined noisy input signal $y_k$ 120. While the original observed noisy input signal $y_k$ 120 is a function of the information signal $s_k$ 100 and the colored noise $n_k$ 110, the whitened output $\hat{y}_k$ 170 is a function of the information signal $s_k$ 100 and a whitened form of the noise $n_k$ 110 (winch means a transformation of the noise to create a whitened noise). The effect of the noise $n_k$ 110 is made white at output $\hat{y}_k$ 170, where it was of originally totally unknown spectrum parameters to start with.

White noise is noise that is totally uncorrelated with its past. By whitening the effect of the noise $n_k$ 110 in the output $\hat{y}_k$ 170, there is no longer a need to iterate blindly in aposteriori filtering, but it can instead work systematically for input noise of any arbitrary spectrum. The aposteriori filtering can now be a one-step process. Since the noise $n_k$ 110 is now transformed by the whitening filter stage 50 to be white noise at signal $\hat{y}_k$ 170, the white noise contained in whitened output signal $\hat{y}_k$ 170 can now be precisely processed, rather than blindly looking for the kind of noise present in signal $y_k$ 120, noting that the parameters of white noise are such $F_0$ of F(B) is one and $F_i=0$ for all i>0, which translates to a flat power spectrum if spectral parameters are to be employed.

The whitened output signal $\hat{y}_k$ 170 is coupled as an input to an aposteriori filter 60 which is the aposteriori white noise removal stage 60 of FIGS. 1A and 1B. The aposteriori filter 60 of FIG. 1C is comprised of a delay subsystem element 155, a non-linear generator subsystem 165, a Fast Fourier Transform (FFT) Subsystem 175, a squaring subsystem 185 where $\hat{y}_k$ is squared, a zero mean subsystem 195, a square rooting subsystem 205 which takes the square root of the zero mean subsystem output, an inverse FFT subsystem 215, and an inverse non-linear function generator subsystem 225.

The delay element 155 stores and delays the BAF output signal $\hat{y}_k$ 170 over a short interval T and provides a delayed output $\hat{y}_k'$ 171. This delay of T is approximately in the range from a few tens of millisecond up to fifty milliseconds if $S_k$ is speech. In general, T must be such that it contains at least about 200 samples of $s_k$ at the Nyquist sampling frequency which is twice the highest frequency of interest in $s_k$. In biological signals, such as in EMG (electromyogram) signals, T will be on the order of a hundred or one hundred-fifty milliseconds. In image processing, the delay can be totally arbitrary, even hours or days. The amount of digital storage required by the delay element 155 depends on the sampling frequency and the selected time delay. The present invention can also be utilized with 2-dimensional pictorial, and high dimensional signal processing.

For example, for speech, with a sampling frequency of 20 Khz, and a time delay T of 50 milliseconds (50 ms=$\frac{1}{20}$ second), 1000 bits of storage (20,000 over 20 is 1000) is needed to store the delayed output $\hat{y}_k'$ 171. The delayed output $\hat{y}_k'$ 171 is coupled as an input to the non-linearity subsystem 165 which multiplies the delayed output $\hat{y}_k'$ 171 by a pre-determined power "m", such as taking the square (m=2) of the delayed output $\hat{y}_k'$ 171, to provide a non-linearized output 172 ($\$_k$). The power can be unity, so that the non-linearized output signal 172 is equal to the delayed output $\hat{y}_k'$ 171. In general, the non-linearized output 172 will be equal to the delayed output 171 raised to a factor (power) of "m", where m is a selected power, usually between 0 and 3, and typically between 0.4 and 2.

These values of m are selected either to enhance the signal $s_k$ or to suppress peaks of the noise $n_k$, so as to fit the data better to the Fourier Transform ("FT") processor 175.

The non-linear output signal 172 is coupled as an input to the FFT subsystem 175 which performs an FFT to provide an amplitude spectrum output signal 180 and a frequency spectrum output 190.

The amplitude spectrum output 180 is coupled as an input to the multiplier subsystem 185 which squares the amplitude spectrum output 180 to provide a power spectrum output 200 which is representative of the power spectrum (or periodagram) of the delayed output $\hat{y}_k'$ 171.

Figure 3B:
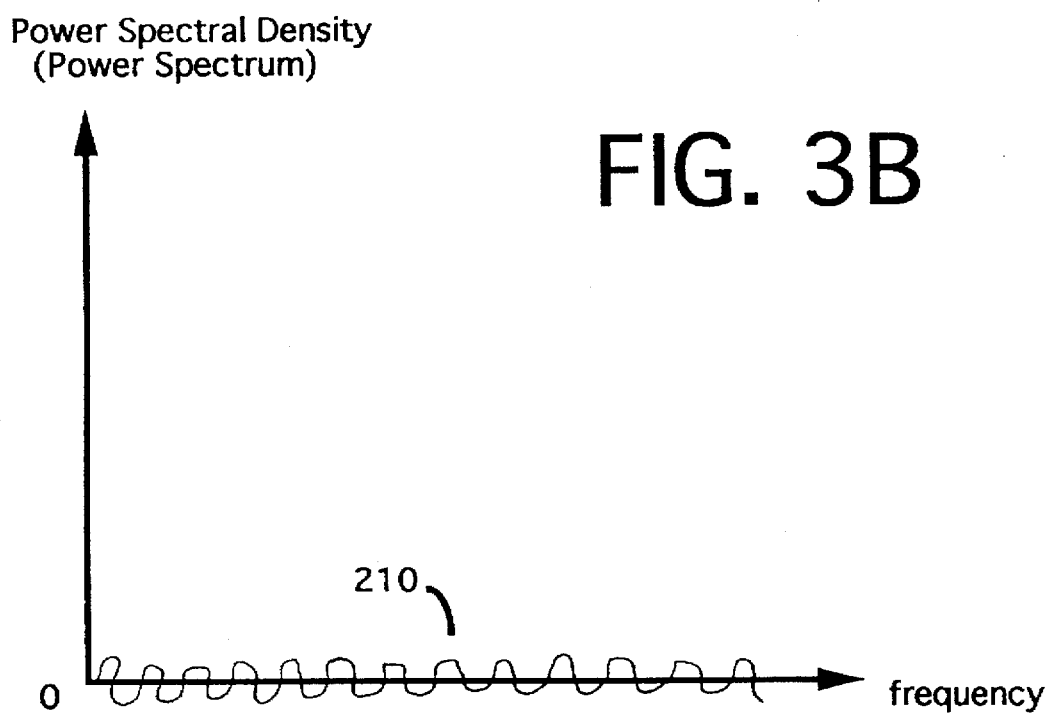
FIG. 3B illustrates the power spectrum after zero mean filtering zero means power spectrum signal 210 as filtered by block 195.

As illustrated in FIGS. 3A, 3B, and FIG. 1, the power spectrum output 200 is coupled as an input to the zero-means subsystem 195 which outputs a zero-mean power spectrum output 210 responsive to shifting the mean of the power spectrum output 200 from a non-zero value K (see FIG. 3A) to a zero-mean value in the zero-mean power spectrum output signal 210 (see FIG. 3B). The power spectrum (also known as the power spectral density) of white noise is a constant, such that removal of the constant value K from the power spectrum output 200 to provide zero-mean power spectrum output 210 permits the removal of the white noise without affecting the information signal $S_k$ 100 content.

The square rooting subsystem 205 takes the square root (removes the power as provided for by the multiplier subsystem 185) from the zero-mean power spectrum output 210 to provide a frequency domain output signal 220, that is nearly (in theory, fully) white-noise free. For example, where multiplier subsystem 185 performs squaring of the amplitude power spectrum output signal 180, the square rooting subsystem 205 performs the square rooting of the zero-mean power spectrum output signal 210.

The frequency domain output 220 is coupled as an input to the inverse FFT subsystem 215. The frequency spectrum output 190 is also coupled as an input to the inverse FFT 215. The inverse FFT 215 provides a time domain signal output $\$_k$** 230, having essentially the same phase as the whitened output signal $\hat{y}_k$ 170. The time domain output signal 230 is essentially the equivalent of the non-linearized output signal 172 except with less white noise, and with the information signal $S_k$ 100 content unchanged. To remove the effect of the non-linear operation of 165 from the signal of 230, it is passed through an inverse non-linearity subsystem 225 where it is operated upon by a power 1/m, noting that the power m was used in stage 165 to yield a signal $\$_k$ 172, which is nearly free of white noise. The time domain output 230 is coupled to the inverse non-linearity subsystem 225 (which removes the non-linearity introduced by the non-linearity subsystem 165 which provides the aposteriori filter output $\$_k$ 240 (which signal 240 has very little white noise content since most of the white noise was removed during processing by the zero mean subsystem 195).

As illustrated, an optional inverse whitening filter subsystem 241 provides an inverse output 242 denoted as $\$_k$* responsive to applying the transform $\emptyset^{-1}(B)$ to the aposteriori filter output 240 $\$_k$.

Also as illustrated, an optional wavelet transform subsystem 235, 245, 255 is provided, wherein a wavelet transform 235 is applied to the aposteriori filter output (or the inverse output 242) to provide a wavelet output 250 $\$'(w)$, wherein $\$'(w)$ is thresholded at 245 such that all data in the wavelet domain at any side of a predetermined threshold function (which is preferably a straight line threshold) is removed, and the remainder output $\$(w)$ 260 is inverse wavelet transformed at 255 to provide a time domain output $\$_k'$ 270. A wavelet transform operation is performed on the aposteriori filter output $\$_k$ 240 via wavelet transform subsystem 235, to provide a wavelet transform output $\$(w)$ 250. The output $\$(w)$ 250 is coupled to thresholding subsystem 245 which performs a thresholding operation.

Figure 4:
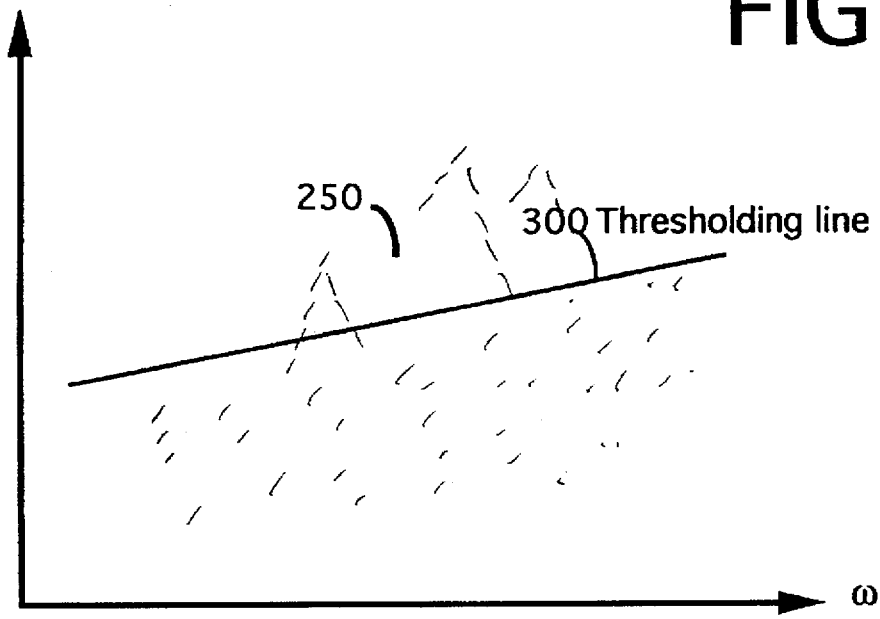
FIG. 4 illustrates the wavelet transform as output 242 as output from the inverse whitening filter 241 (as illustrated in FIGS. 1C, 1D, and 1F) illustrating the threshold line 300 (showing the threshold level applied by threshold means 245) in relation to the wavelet waveform output 250.
Figure 5:
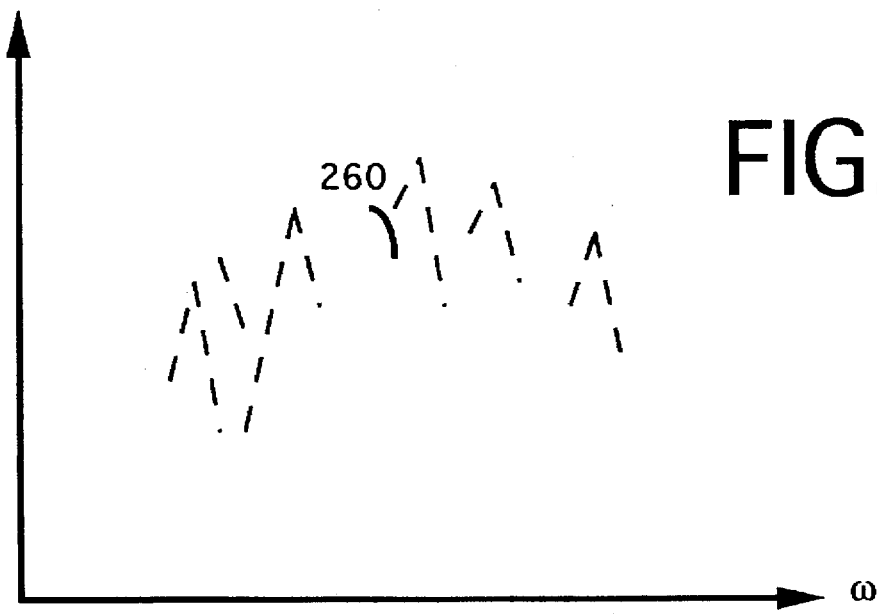
FIG. 5 illustrates the wavelet transform output 260 after threshholding the transform of FIG. 4.
Figure 6A:
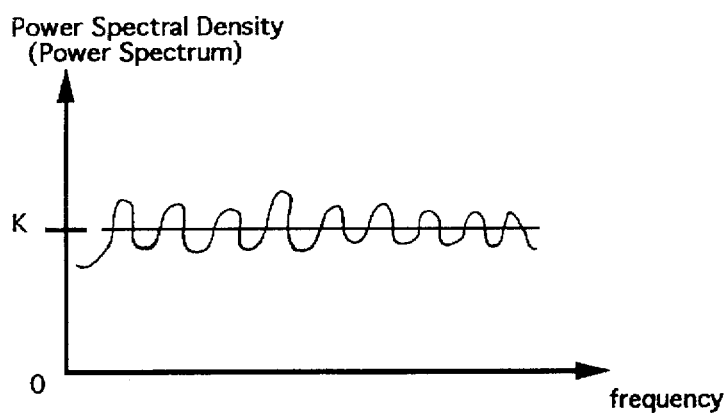
FIGS. 6A illustrates the raw power spectrum output (analogous to FIG. 3A)
Figure 6B:
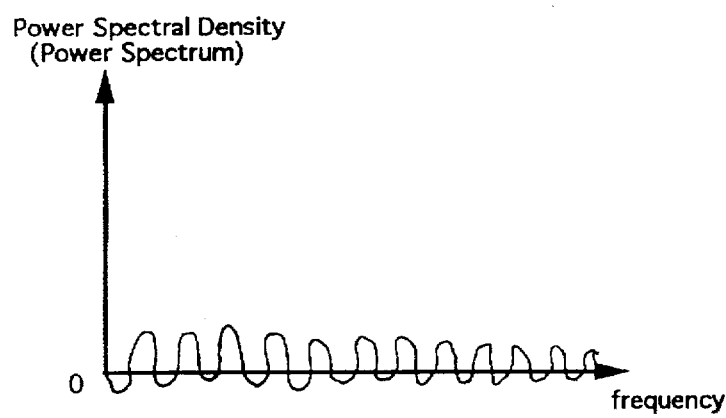
FIG. 6B illustrates the power spectrum after removal of constant power (analogous to FIG. 3B), illustrating liftering instead of white noise removal, that is showing the power spectrum before and after liftering process.
Figure 6C:
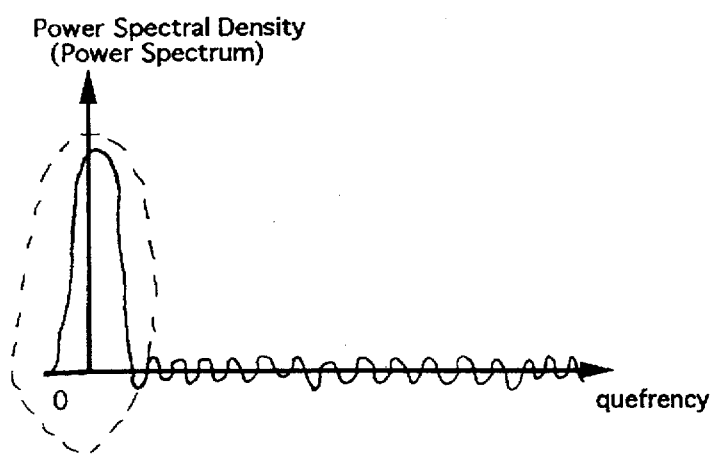
FIG. 6C illustrates the process of liftering, which is the removal of the zero quefrency component of the power spectrum of FIG. 6A.

As illustrated in FIG. 4, the wavelet transform output $\$(w)$ 250 is comprised of a group of data points (appearing "cloudy") below a threshold line 300 and a few data points (appearing as scattered "blips") above the predefined threshold line 300. After performing the thresholding in subsystem 245, the thresholded wavelet output $\$(w)$ 260 is provided as illustrated in FIG. 5, wherein the cloudy group of data points has been removed (from below the threshold) to yield the output $\$(w)$ 260 comprised of only the scattered blip data points (from above the threshold line 300).

The output $\$(w)$ 260 is coupled to the input of inverse wavelet transform subsystem 255, which performs an inverse transform to that performed by wavelet transform subsystem 235 to provide a wavelet filter output $S^*_k$ 270.

FIG. 1D illustrates an alternate embodiment of the system of FIG. 1C, wherein the inverse whitening filter stage 241 is repositioned from before the wavelet filtering stage to after it. Its final output $\$'_k$ is as in FIG. 1C.

Figure 1E:
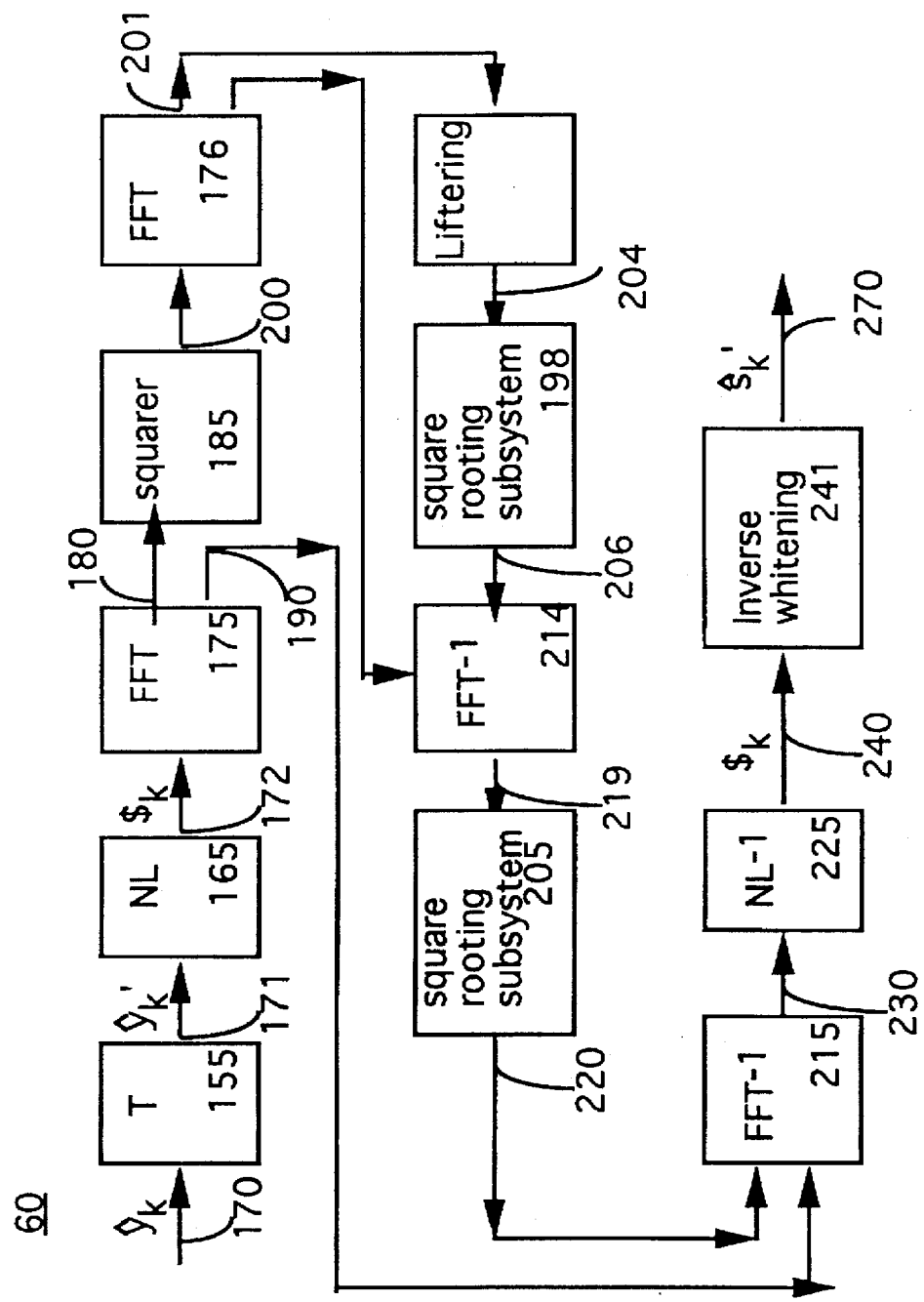
FIG. 1E is an alternate embodiment of the system of FIG. 1B, wherein the aposteriori white noise removal stage of FIG. 1B is replaced with the liftering stage of FIG. 1E.

FIG. 1E illustrates an alternate embodiment of the aposteriori white noise removal stage 60 of FIG. 1A, wherein the aposteriori filtering stage of FIG. 1B is replaced with the liftering filter stage of FIG. 1E. Its final output $\$'_k$ is as in FIG. 1C.

Figure 1F:
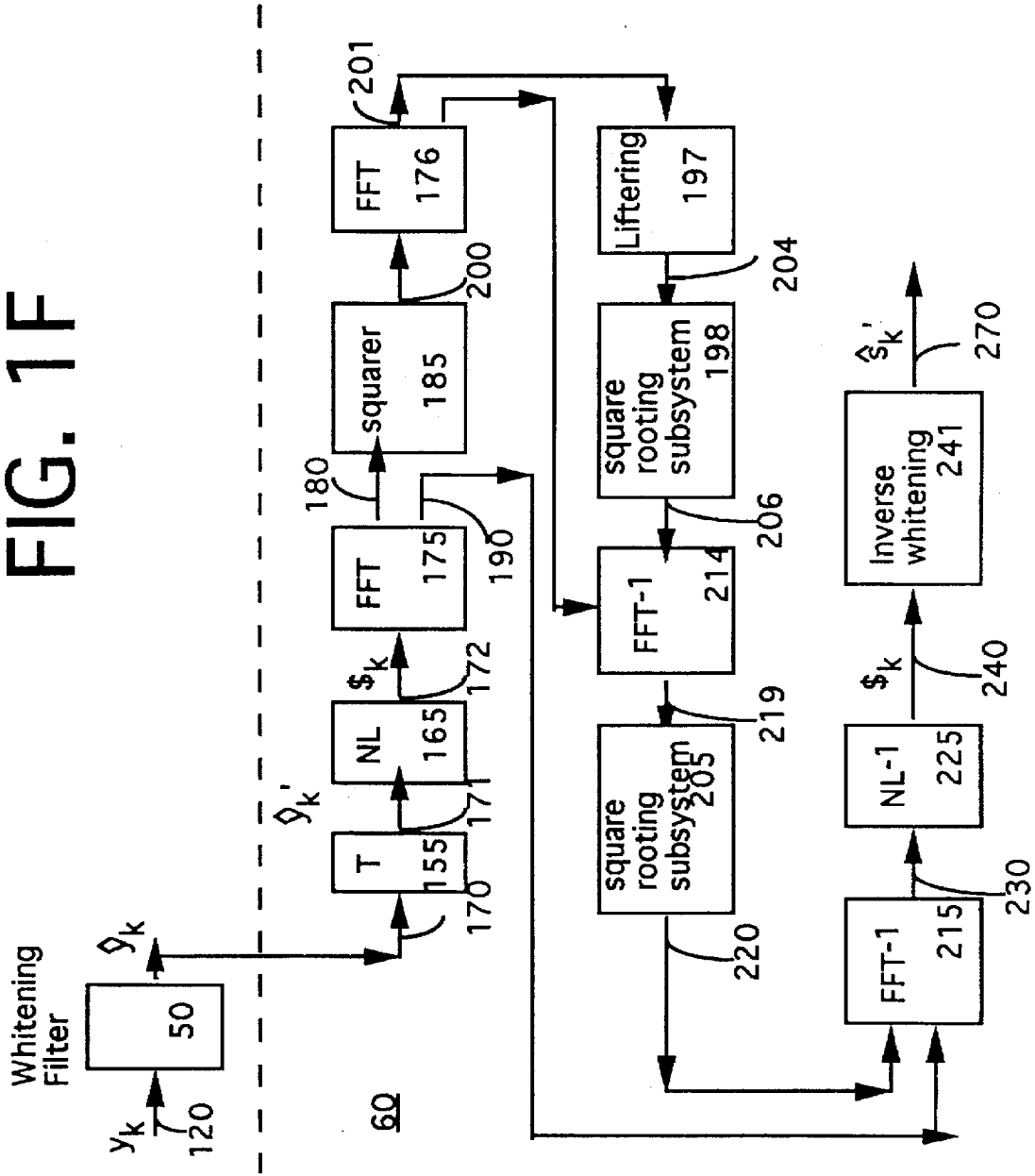
FIG. 1F is an alternate embodiment of the system of FIG. 1C, wherein the aposteriori white noise removal stage 60 (from FIG. 1B) is replaced with the liftering stage (from FIG. 1E)

FIG. 1F is an alternate embodiment of the system of FIG. 1C, wherein the aposteriori filtering stage 60 (from FIG. 1B) is replaced with the liftering filter stage (from FIG. 1E). Its final output $\$'_k$ is as in FIG. 1C.

This realization of the aposteriori white noise removal stage 60 is afforded by liftering, such that whitened noisy input $\hat{y}_k$ 170 is passed through subsystems 165, 175, as in FIG. 1C, and then through a squaring multiplier 185 and another FFT transformation stage 176 and then through another multiplier 196 and then through a liftering stage 197 where the cepstrum (spectrum of the spectrum) at the output of the second FFT stage is removed at around zero-quefrency, and then passing the liftered output 204 through an inverse FFT (FFT$^{-1}$) 214 prior to coupling its output to the square root subsystem 205, the inverse FFT subsystem 215, the inverse non-linearity subsystem 225, and the optional inverse whitening stage 241, as described with reference to FIG. 1C.

Figure 7:
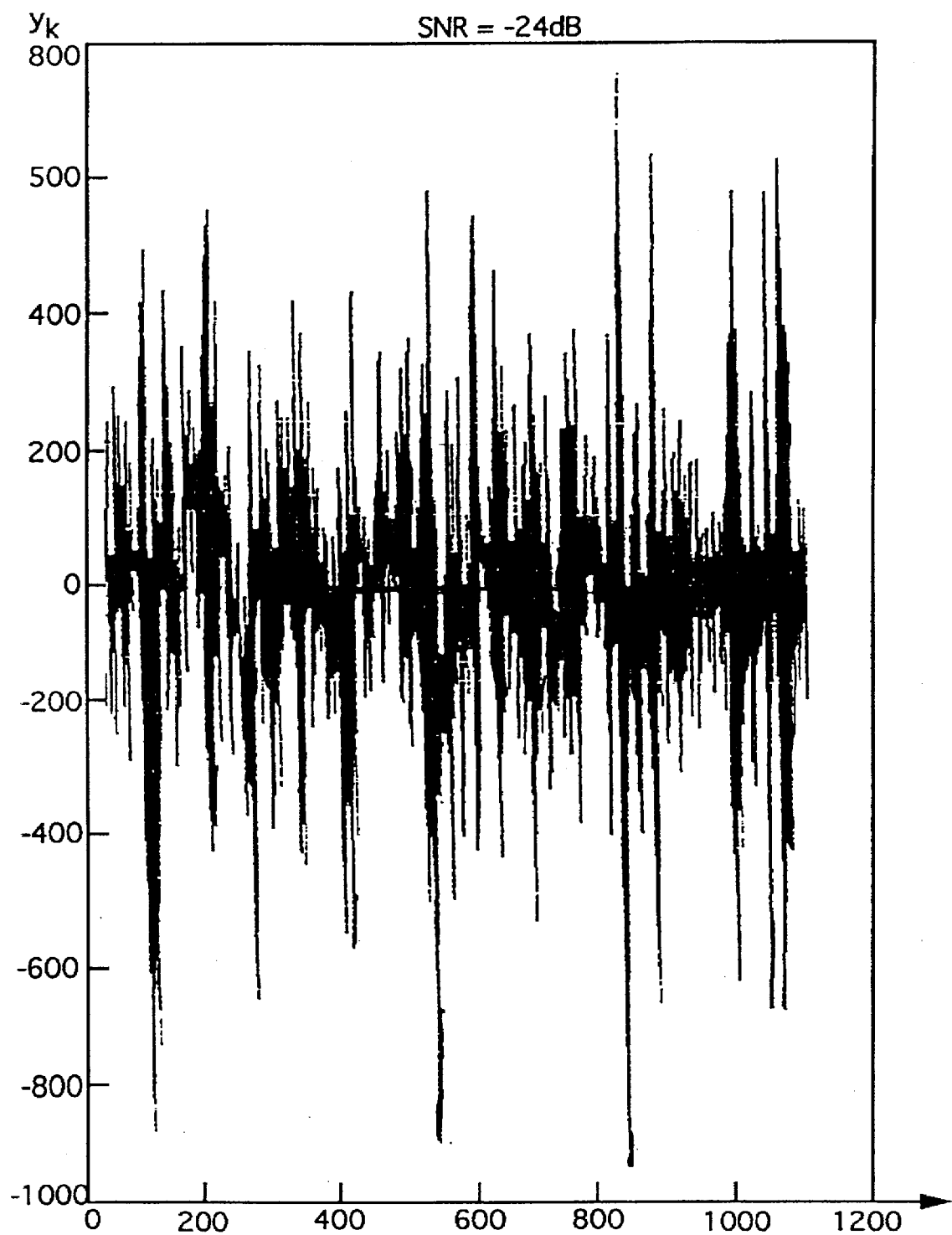
FIG. 7 illustrates the signal plus noise at −24 dB which is $y_k$ 120 as illustrated in FIG. 1A.
Figure 8:
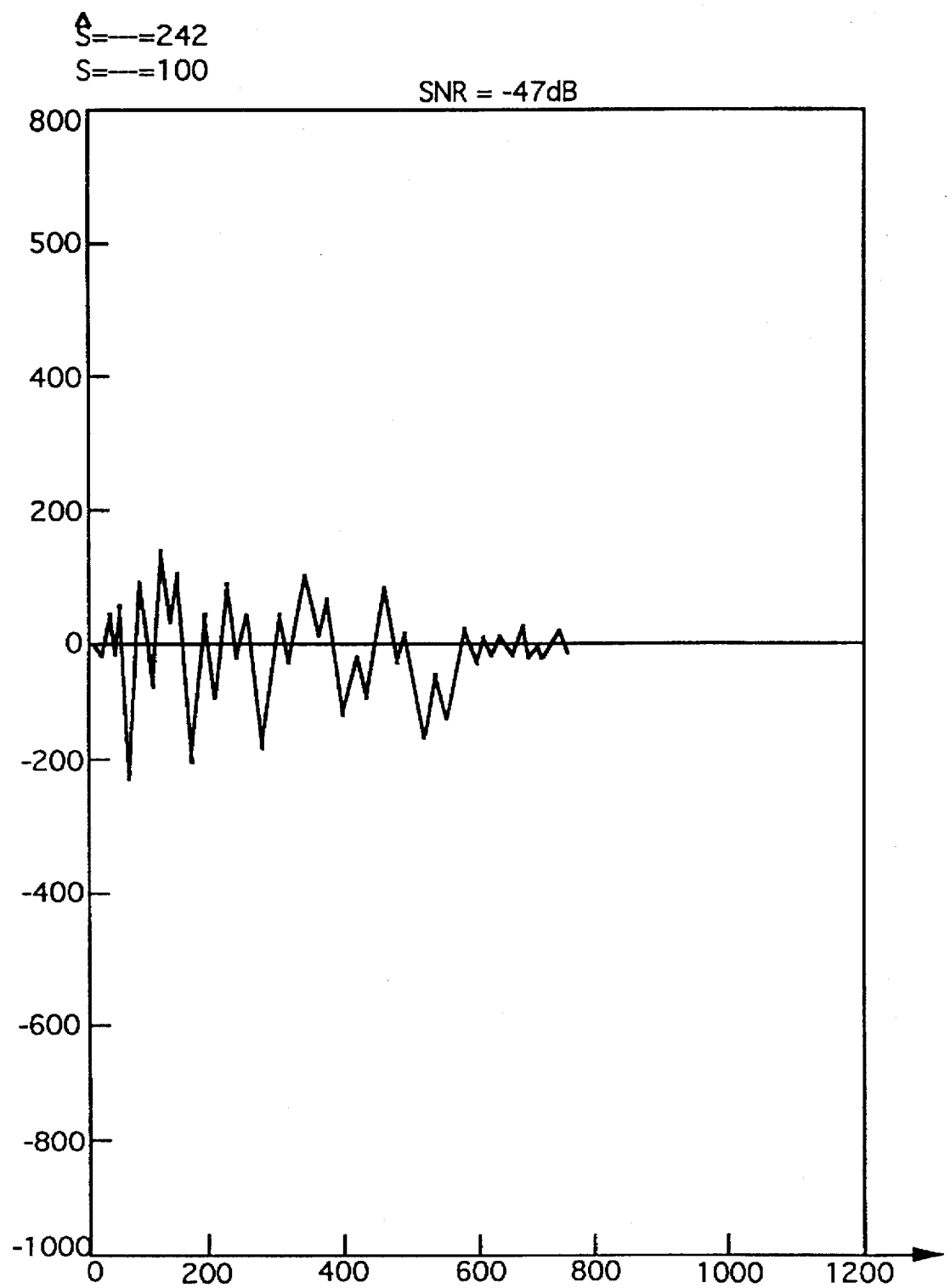
FIG. 8 illustrates the signal $\hat{s}_k$ 242 of FIG. 1C in dashed lines, and $s_k$ 100 of FIG. 1C in solid lines for the signal plus noise situation of FIG. 7, where the solid waveform indicates the original signal and where the dashed line indicates the filtered signal.

Since the signal $S^*_k$ at 240 still carries the effect of the whitening filtering operation $\emptyset(B)$ of 125 in the whitening stage 50, this effect is now removed in operation 241, which serves as an inverse whitening operator $\emptyset^{-1}(B)$. The output of that inverse filter 241, denoted as $\$_k$ (242) in FIG. 1C or as $\$'_k$ (272) in FIG. 1D, is already relatively clean of noise (as indicated in dashed lines FIG. 8) even if it does not go through a wavelet filtering stage (e.g., subsystems 235, 245, 255) as compared to the original signal (illustrated in solid lines in FIG. 8), and as compared to the noisy signal $y_k=s_k+n_k$ (as illustrated in FIG. 7). The wavelet filtering stage thus serves only as an additional stage of noise removal when a very clean output is required.

As discussed above, and as illustrated in FIG. 1F, the output 242 is further passed through a wavelet filter comprising of elements 235, 245, and 255, where a D4 wavelet transformation is applied to $\hat{s}_k$, to provide a transformed output 250 which is then passed through a thresholding element 245 where only the portions of 250 that are beyond a pre-assigned threshold are kept to be subsequently inverse wavelet transformed at 255 to yield the final system's output $\hat{s}_k'$ 270. Thus, achieving removal of high levels of noise from an input signal $y_k$ 120 with no prior knowledge of spectral or other parameters of either signal or noise, is performed in a totally blind manner.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed is:

1. A system for filtering a noisy input signal ($y_k$) comprised of an information signal ($s_k$) imbedded in noise ($n_k$), wherein $y_k=s_k+n_k$, where there is no prior information on the spectra or other parameters of the information signal ($s_k$) or of the noise ($n_k$) and where there is no separate access to information signal or to the noise, the system comprising:

whitening filter means, responsive to the noisy input signal ($y_k$), for whitening the noise ($n_k$) in the noisy input signal ($y_k$), for providing a whitened noisy output ($\hat{y}_k$) comprised of the information signal ($s_k$) and a white noise residual of the noise; and aposteriori filter means responsive to the whitened noisy output ($\hat{y}_k$), comprised of:
   (a) a time delay subsystem for storing the whitened noisy output ($\hat{y}_k$) over a fixed time delay (T);
   (b) a first non-linear function generator for providing a first non-linear function output ($\$_k$), responsive to raising the whitened noisy output ($\hat{y}_k$) by a power of m;
   (c) an FFT subsystem for deriving the FFT of the first nonlinear function whitened noise output ($\$_k$), for providing both amplitude and phase spectrum outputs;
   (d) a multiplier subsystem for providing a power spectrum output responsive to the amplitude whitened noise output;
   (e) a zero-mean subsystem responsive to the power spectrum output for providing a zero mean power spectrum output;
   (f) a square rooting subsystem for taking the square root of the zero mean power spectrum output;
   (g) an inverse FFT subsystem responsive to the zero mean power spectrum output and the FFT phase spectrum output for performing an inverse FFT and providing a new time domain signal output ($\$_k^*$) wherein the white noise residual of the whitened noisy output ($\hat{y}_k$) is substantially reduced; and
   (h) a second non-linear function generator for providing a second non-linear function output ($s_k^*$), responsive to raising the new time domain signal output by a power of 1/m.

2. The system as in claim 1, wherein m is a positive integer.

3. The system as in claim 1, wherein the information signal is further characterized as representative of a line in a scanned multidimensional image, wherein the system removes noise from the multidimensional image.

4. The system as in claim 1, further comprising:

a wavelet transform subsystem, wherein a wavelet transform is applied to the new time domain signal ($\$_k^*$) to provide a wavelet output ($\hat{s}(w)$), wherein ($\hat{s}'(w)$) is thresholded such that all data in a wavelet domain that is not equal to a predetermined threshold function is removed and a remainder output ($\$(w)$) from the predetermined threshold function is inverse wavelet transformed to provide a time domain output ($\hat{s}_k'$).

5. The system as in claim 4, further comprising:

an inverse whitening filter subsystem for providing a system output ($s_k^{**}$) responsive to inversely whitening the wavelet output ($\hat{s}'(w)$).

6. The system as in claim 1, wherein the whitening filter means is further comprised of:

an active noise cancellation system for providing the whitened noisy output ($\hat{y}_k$) responsive to the noisy input signal ($y_k$).

7. The system as in claim 1, wherein the whitening filter means is further comprised of:

blind adaptive filter (BAF) whitening stage means, responsive to the noisy input signal ($y_k$), for self-adaptively whitening the noise ($n_k$) in the noisy input signal ($y_k$), comprising means for providing an output parameter set p(n) representative of parameters of the noise ($n_k$) as separated and identified from the information signal ($s_k$) responsive to the noisy input signal ($y_k$), and means for providing a BAF output as the whitened noisy output ($\hat{y}_k$) comprised of the information signal ($s_k$) and a white noise residual of the noise responsive to performing a transformation $\emptyset(B)$ on the noisy input ($y_k$) responsive to the output parameter set $p_{(n)}$, to provide the the whitened noisy output ($\hat{y}_k$), where B is a unit delay operator and $$\phi(B) = \frac{\hat{y}_k(B)}{y_k(B)} ;$$

wherein $\emptyset(B)$ is repeatedly updated at intervals larger than a fixed time delay (T), and wherein $\emptyset(B)$ has an inverse transformation $\emptyset^{-1}(B)$.

8. The system as in claim 7, further comprising:

an inverse whitening filter subsystem for providing an output denoted as ($s_k^{**}$) responsive to applying the inverse transform $\emptyset^{-1}(B)$ to the second non-linear function output ($s_k^*$).

9. The system as in claim 8, further comprising:

a wavelet transform subsystem, wherein a wavelet transform is applied to the new time domain output ($\$_k^*$) to provide a wavelet output ($\hat{s}'(w)$), wherein ($\hat{s}'(w)$) is thresholded such that all data in the wavelet domain not equal to the predetermined threshold function is removed and the remainder output ($\$(w)$) of the predetermined threshold function is inverse wavelet transformed to provide a time domain output ($\hat{s}_k'$).

10. The system as in claim 9, wherein said predetermined threshold function is a straight line threshold.

11. The system as in claim 8, wherein the inverse whitening filter sub-system output ($s_k^{**}$) is coupled back as an input to the BAF whitening stage means, in an iterative manner.

12. A system for filtering a whitened noisy input signal ($\hat{y}_k$) comprised of an information signal and whitened noise, comprising:

aposteriori filter means, responsive to the whitened noisy input signal ($\hat{y}_k$) comprised of:
(a) a time delay subsystem for storing the whitened noisy input signal ($\hat{y}_k$) over the fixed time delay (T);
(b) a first non-linear function generator for providing a first non-linear function output ($\$_k$), responsive to raising the whitened noisy input ($\hat{y}_k$) by a power of m;
(c) an FFT subsystem for deriving the FFT of the first nonlinear function output ($\$_k$), for providing both amplitude and phase spectrum outputs;
(d) a multiplier subsystem for providing a power spectrum output responsive to the amplitude output;
(e) a zero-mean subsystem responsive to the power spectrum output for providing a zero mean power spectrum output;
(f) a square rooting subsystem for providing a square rooted zero mean power spectrum output responsive to taking the square root of the zero mean power spectrum output;
(g) an inverse FFT subsystem responsive to the square rooted zero mean power spectrum output and the FFT phase spectrum output for performing an inverse FFT and providing a new time domain signal output ($\$_k^*$) wherein a white noise residual of the whitened noisy input ($\hat{y}_k$) is substantially reduced; and
(h) a second non-linear function generator for providing a second non-linear function output ($s_k^*$), responsive to raising a new time domain output ($\$_k^*$) by a power of 1/m.

13. The system as in claim 12, wherein the information signal is further characterized as representative of a line in a scanned multi-dimensional image, wherein the system removes noise from the multi-dimensional image.

14. A method for filtering a noisy input comprised of an information-bearing signal and noise where no prior time domain value information or frequency domain parameter value information on the information bearing signal or noise is available and where no separate access to the information bearing signal or to the noise exists, the method comprising:
(a) passing the noisy input through a whitening filter to render the noise part of the noisy input to become substantially white noise of a flat spectrum over the spectral range of interest and to provide a time domain output;
(b) applying a non-linear function to the time domain output to provide a non-linear function output;
(c) Fourier transforming the time domain output over successive finite frames of time to provide a first transformed output;
(d) Fourier transforming the first transformed output to provide a second transformed output;
(e) liftering the second transformed output by blocking near zero quefrencies to provide a liftered output;
(f) inverse Fourier transforming the liftered output to provide an inverse transformed output;
(g) inverse Fourier transforming the inverse transformed output to provide a new time domain output;
(h) applying an inverse of the non-linear function to the new time domain output to provide a resultant output;
(i) passing the resultant output through an inverse whitening filter, to provide a substantially noise-free final output wherein the spectrum of the information bearing signal is unchanged and wherein the noise has been first whitened and then removed.

15. The method as in claim 14, wherein the information bearing signal is further characterized as representative of a line in a scanned multidimensional image, wherein the system removes noise from the multidimensional image.

16. The method as in claim 14, wherein the step of passing the noisy input through a whitening filter is further comprised of the steps of:
(a1) passing the noisy input through a parameter identifier to identify its parameters;
(a2) separating these identified parameters into two parameter subsets, one subset comprising the information signal's parameters and the other subset comprising the noise parameters;
(a3) passing the noisy input through a spectrum shaping whitening filter responsive to the noise parameters to render the noise part of the noisy input to become substantially white noise of a flat spectrum over the spectral range of interest and to provide a time domain output.

17. The method as in claim 14, wherein the step of passing the noisy input through a whitening filter is further comprised of the steps of:
passing a noisy signal through an active noise cancellation system to provide a resultant time domain output.

18. A system for filtering a noisy input comprised of an information-bearing signal and a noise part where no prior time domain value information or frequency domain parameter value information on the information bearing signal or noise is available and where no separate access to the information bearing signal or to the noise exists, the system comprising:
(a) a spectrum shaping whitening filter responsive to the noisy input for rendering the noise part of the noisy input to become substantially white noise of a flat spectrum over the spectral range of interest and to provide a time domain output;
(b) means for Fourier transforming the time domain output over successive finite frames of time to provide an amplitude spectrum output and a phase output;
(c) a multiplier for providing a power spectrum output responsive to the amplitude spectrum output;
(d) means for providing a zero mean power spectrum output responsive to the power spectrum output;
(e) means for applying an inverse function of the multiplier to provide a resultant output;
(f) means for inverse Fourier transforming the resultant output to provide a time domain resultant output; and
(g) an inverse whitening filter, responsive to the time domain resultant output, for providing a substantially noise-free final output wherein the spectrum of the information bearing signal is unchanged and wherein the noise has been first whitened and then removed.

19. The system as in claim 18, wherein the information bearing signal is further characterized as representative of a line in a scanned multidimensional image, wherein the system removes noise from the multidimensional image.

20. The system as in claim 18, wherein the inverse whitening filter is further comprised of a non-linear function generator for raising the time domain resultant output to a power of m, prior to output of the time domain resultant output; and
wherein the system is further comprised of an inverse non-linear function generator for raising the time domain resultant output to a power of 1/m, to provide a modified time domain resultant output, wherein the inverse whitening filter is responsive to the modified time domain resultant output.

21. The system as in claim 18, wherein the inverse whitening filter is further characterized as a blind adaptive filter.

22. The system as in claim 18, wherein the inverse whitening filter is further characterized as an active noise cancellation filter.

23. The system as in claim 18, wherein the final output is coupled back to the means for Fourier transforming, wherein the means for Fourier transforming is thereafter responsive only to the final output, wherein the system provides iterative processing comprised of multiple processing stages to provide the substantially noise-free final output.

24. The system as in claim 18, further comprising:
wavelet filter means for providing a wavelet transformed output wherein the substantially noise-free final output is wavelet transformed to cluster the substantially white noise to provide clustered substantially white noise in the wavelet transformed output;
a threshold subsystem for processing the wavelet transformed output to eliminate the clustered white noise while preserving the information-bearing signal to provide a threshold output; and
means for applying an inverse wavelet transform to the thresholded output to provide a wavelet filtered time domain output.

25. A method to filter inaccessible and unknown noise of arbitrary parameters from a noisy input, comprised of an information-bearing signal combined with a noise part, where no prior time domain parameters value or frequency spectrum domain parameters value on the information-bearing signal or the noise is available and where no separate access to the information-bearing signal or to the noise exists, the method comprising the steps of:
passing the noisy input through a whitening filter to render the noise part of the noisy input to become substantially white noise of a flat power spectrum over the spectral range of interest to provide a time domain output;
passing the time domain output through a white noise removal stage where the time domain output is Fourier transformed over successive finite frames of time to yield the time domain output's power spectrum of the output of the whitening filter and the time domain output's frequency spectrum;
spectrally filtering the power spectrum by subtracting the d.c. average of the power spectrum from the power spectrum;
inverse Fourier transforming the results of the spectral filtering the frequency spectrum to provide a resultant time domain output; and
passing the resultant time domain output through an inverse whitening filter, which is the inverse of the whitening filter used prior to the Fourier transform, to provide a substantially noise-free output.

26. The method as in claim 25, wherein the substantially noise-free output is further characterized in that the spectrum of the information-bearing signal is unchanged.

27. The method as in claim 25, further comprising the steps of:
passing the substantially noise-free output through a wavelet filter where the substantially noise-free output is wavelet transformed to cluster white noise in the substantially noise-free output to provide a wavelet transformed output wherein the substantially white noise is clustered;
passing the wavelet transformed output through a threshold subsystem to eliminate the clustered substantially white noise while preserving the information signal to provide a threshold output; and
applying an inverse wavelet transform to the threshold output to provide a wavelet filtered time domain output.

28. The method as in claim 25, wherein the step of passing the noisy input through a whitening filter is further comprised of the steps of:
passing the noisy input through a parameter identifier to identify its parameters;
passing the noisy input through a spectrum-shaping whitening filter that utilizes the noise parameters to render the noise part of the noisy input to become substantially white noise of a flat power spectrum over the spectral range of interest to provide the resultant time domain output.

29. The method as in claim 25, wherein the step of passing the noisy input through a whitening filter is further comprised of the step of passing the noisy input through an active noise cancellation filter to provide the resultant time domain output.

30. A system for filtering inaccessible and unknown noise of arbitrary parameters from a noisy input, comprised of an information-bearing signal combined with a noise part, where no prior time domain parameters value or frequency domain parameters value on the information-bearing signal or the unknown noise is available and where no separate access to the information-bearing signal or to the unknown noise exists, the system comprising:
means for passing the noisy input through a whitening filter to render the noise part of the noisy input to become substantially white noise of a flat power spectrum over the spectral range of interest to provide a time domain output;
means for passing the time domain output through a white noise removal stage where the time domain output is Fourier transformed over successive finite frames of time to yield the time domain output's power spectrum of the output of the whitening filter and the time domain output's frequency spectrum;
means for spectrally filtering the power spectrum by subtracting the d.c. average of the power spectrum from the power spectrum;
means for inverse Fourier transforming the results of the spectral filtering the frequency spectrum to provide a resultant time domain; and
means for passing the resultant time domain output through an inverse whitening filter, which is the inverse of the whitening filter used prior to the Fourier transform, to provide a substantially noise-free output.

31. The system as in claim 30, wherein the substantially noise-free output is further characterized in that the spectrum of the information-bearing signal is unchanged.

32. The system as in claim 30, further comprising:
means for passing the substantially noise-free output through a wavelet filter where the substantially noise-free output is wavelet transformed to cluster substantially white noise in the substantially noise-free output to provide a wavelet transformed output wherein the substantially white noise is clustered;
means for passing the wavelet transformed output through a threshold subsystem to eliminate the clustered white noise while preserving the information-bearing signal to provide a threshold output; and
means for applying an inverse wavelet transform to the threshold output to provide a wavelet filtered time domain output.

* * * * *